(12) United States Patent
Huang

(10) Patent No.: US 12,484,293 B2
(45) Date of Patent: Nov. 25, 2025

(54) SEMICONDUCTOR DEVICES AND METHODS OF MANUFACTURE

(71) Applicant: Taiwan Semiconductor Manufacturing Company, Ltd., Hsinchu (TW)

(72) Inventor: Yu-Lien Huang, Jhubei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 179 days.

(21) Appl. No.: 18/362,254

(22) Filed: Jul. 31, 2023

(65) Prior Publication Data

US 2023/0378171 A1    Nov. 23, 2023

Related U.S. Application Data

(62) Division of application No. 17/446,255, filed on Aug. 27, 2021, now Pat. No. 11,764,215.

(60) Provisional application No. 63/200,863, filed on Mar. 31, 2021.

(51) Int. Cl.
*H10D 84/83* (2025.01)
*H01L 21/311* (2006.01)
*H10D 64/01* (2025.01)

(52) U.S. Cl.
CPC ........ *H10D 84/83* (2025.01); *H01L 21/31116* (2013.01); *H10D 64/01* (2025.01); *H10D 64/015* (2025.01)

(58) Field of Classification Search
CPC ...... H10D 84/83; H10D 64/01; H10D 64/015; H10D 30/797; H10D 64/017; H10D 84/0186; H10B 10/12
See application file for complete search history.

(56) References Cited

U.S. PATENT DOCUMENTS

| | | |
|---|---|---|
| 2007/0224775 A1 | 9/2007 | Lindert |
| 2016/0293717 A1* | 10/2016 | Kim ............... H10D 62/151 |
| 2018/0076044 A1 | 3/2018 | Choi et al. |
| 2018/0226259 A1 | 8/2018 | Choi et al. |
| 2019/0006493 A1 | 1/2019 | Young et al. |

(Continued)

*Primary Examiner* — Fernando L Toledo
*Assistant Examiner* — Adam S Bowen
(74) *Attorney, Agent, or Firm* — Harrity & Harrity, LLP

(57) ABSTRACT

Various semiconductor techniques described herein enable reductions in one or more sizes of a fin field-effect transistor (finFET) and/or increasing one or more sizes of a finFET. In various implementations described herein, a material may be used to reduce the one or more x-direction sizes of the finFET by selective deposition while enabling the one or more y-direction sizes of the finFET to be increased or enlarged by etching. The x-direction size of a source or drain of the finFET, the x-direction size of an active region of the finFET, and/or the x-direction size of a polysilicon region of the finFET may be increased by selective deposition of a boron nitride ($B_xN_y$), a boron carbide ($B_xC$), a boron oxide ($B_xO_y$) (e.g., boric oxide ($B_2O_3$)), a fluorocarbon (CxFy) polymer, and/or another material.

20 Claims, 28 Drawing Sheets

(56) References Cited

U.S. PATENT DOCUMENTS

| | | |
|---|---|---|
| 2019/0139811 A1 | 5/2019 | Jang et al. |
| 2019/0164822 A1 | 5/2019 | Chou et al. |
| 2019/0165137 A1* | 5/2019 | Chen .................. H10D 84/853 |
| 2020/0006556 A1 | 1/2020 | Huang et al. |
| 2020/0035549 A1 | 1/2020 | Wu |
| 2020/0105908 A1 | 4/2020 | Tsai et al. |
| 2020/0135550 A1 | 4/2020 | Chen et al. |
| 2020/0194272 A1 | 6/2020 | Jain et al. |
| 2021/0005472 A1 | 1/2021 | Kanarik et al. |
| 2022/0320081 A1 | 10/2022 | Huang |

* cited by examiner

SEMICONDUCTOR DEVICES AND METHODS OF MANUFACTURE

CROSS-REFERENCE TO RELATED APPLICATIONS

This Patent Application is a divisional of U.S. patent application Ser. No. 17/446,255, filed Aug. 27, 2021, and entitled "SEMICONDUCTOR DEVICES AND METHODS OF MANUFACTURE," which claims priority to U.S. Provisional Patent Application No. 63/200,863, filed on Mar. 31, 2021, and entitled "SEMICONDUCTOR DEVICES AND METHODS OF MANUFACTURE." The disclosures of the prior Applications are considered part of and are incorporated by reference into this Patent Application.

BACKGROUND

A field-effect transistor (FET) is a type of transistor that uses an electric field to control the flow of current. A FET includes three terminals: a source, a gate, and a drain. In operation, a FET controls the flow of current through the application of a voltage to the gate which, in turn, alters conductivity between the drain and the source. A commonly used type of FET is a metal-oxide-semiconductor field-effect transistor (MOSFET). A MOSFET can be used, for example, as a switch for an electrical signal (e.g., a radio frequency (RF) switch), as an amplifier for an electrical signal (e.g., a low-noise amplifier (LNA)), or in complementary metal oxide semiconductor (CMOS) logic (e.g., static random access memory (SRAM) and other types of memory devices), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
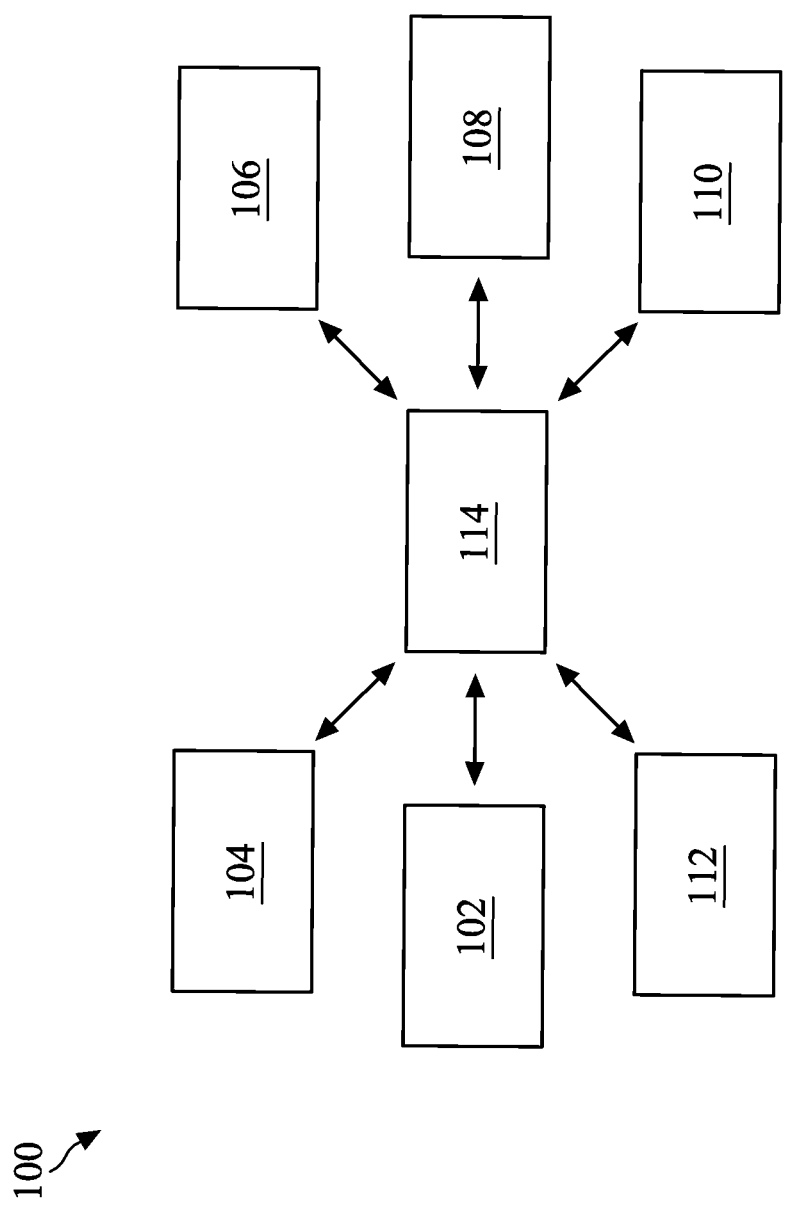
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A field-effect transistor (FET) may be realized in various physical implementations. As an example, a FET may be implemented as a two-dimensional planar transistor, in which the source and drain are separated by a channel, and the gate is located over (e.g., directly above and on top of) the channel and above (e.g., higher than but not necessarily over or on top of) the source and drain. As another example, a FET may be implemented as a three-dimensional transistor such as a finFET or a nanostructure transistor (e.g. nanowire transistor, nanosheet transistor, gate all around transistor, multi bridge channel transistor, nanoribbon transistor, etc.). A finFET may include a fin that functions as the channel, which permits the gate (e.g., a metal gate (MG)) to wrap around three sides of the channel, thereby enabling increased control over the channel (and therefore switching of the finFET). The source/drain contacts (e.g., metal drain (MD) contacts) are formed around the fin on opposing sides of the gate, and the gate controls the channel to enable or to block the flow of current from the source to the drain through the fin.

As transistor sizes continue to shrink, various semiconductor manufacturing challenges pertaining to finFETs and other types of transistors arise. In some cases, etching capabilities may not support a reduction in the x-direction size of an MD (e.g., the width of the MD along a gate direction of a finFET) of a finFET and increasing the y-direction size of the MD (e.g., the width of the MD along a fin direction of the finFET). In some cases, the end-to-end capabilities and the etch capabilities of an active region of a finFET may not support reducing in the x-direction size of the active region or increasing the y-direction size of the active region. In some cases, the end-to-end capabilities and the etch capabilities of a poly region (e.g., a polysilicon region or another type of poly region) of a finFET may not support reducing the x-direction size of the poly region or increasing the y-direction size of the poly region.

Some implementations described herein provide various semiconductor structures and techniques for reducing one or more sizes of a finFET (and/or another type of semiconductor transistor) and/or increasing one or more sizes of a finFET. In various implementations described herein, a boron nitride ($B_xN_y$), a boron carbide ($B_xC$), a boron oxide ($B_xO_y$) (e.g., boric oxide ($B_2O_3$)), a fluorocarbon (CxFy) polymer, a tungsten carbide ($WC_x$) and/or another material may be used to reduce the one or more x-direction sizes of the finFET by selective deposition while enabling the one or more y-direction sizes of the finFET to be increased or enlarged by etching. For example, the x-direction size of an MD of the finFET, the x-direction size of an active region of the finFET, and/or the x-direction size of a poly region of the finFET may be increased by selective deposition of a boron nitride ($B_xN_y$), a boron carbide ($B_xC$), a boron oxide ($B_xO_y$) (e.g., boric oxide ($B_2O_3$)), a fluorocarbon (CxFy) polymer, a tungsten carbide ($WC_x$), and/or another material. The selective deposition may permit the one or more y-direction sizes of a finFET to be increased by etching.

In this way, reducing one or more x-direction sizes of a finFET using the techniques described herein may permit CMOS logic device sizes (e.g., cell sizes of SRAM devices and/or other types of memory devices) to be reduced. Moreover, increasing one or more y-direction sizes of a finFET using the techniques described herein may permit various semiconductor processing windows to be enlarged, which may increase semiconductor manufacturing quality and semiconductor manufacturing yield.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is used to transport wafers and/or dies between semiconductor processing tools 102-112 and/or to and from other locations such as a wafer rack, a storage room, and/or the like. In some implementations, wafer/die transport tool 114 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
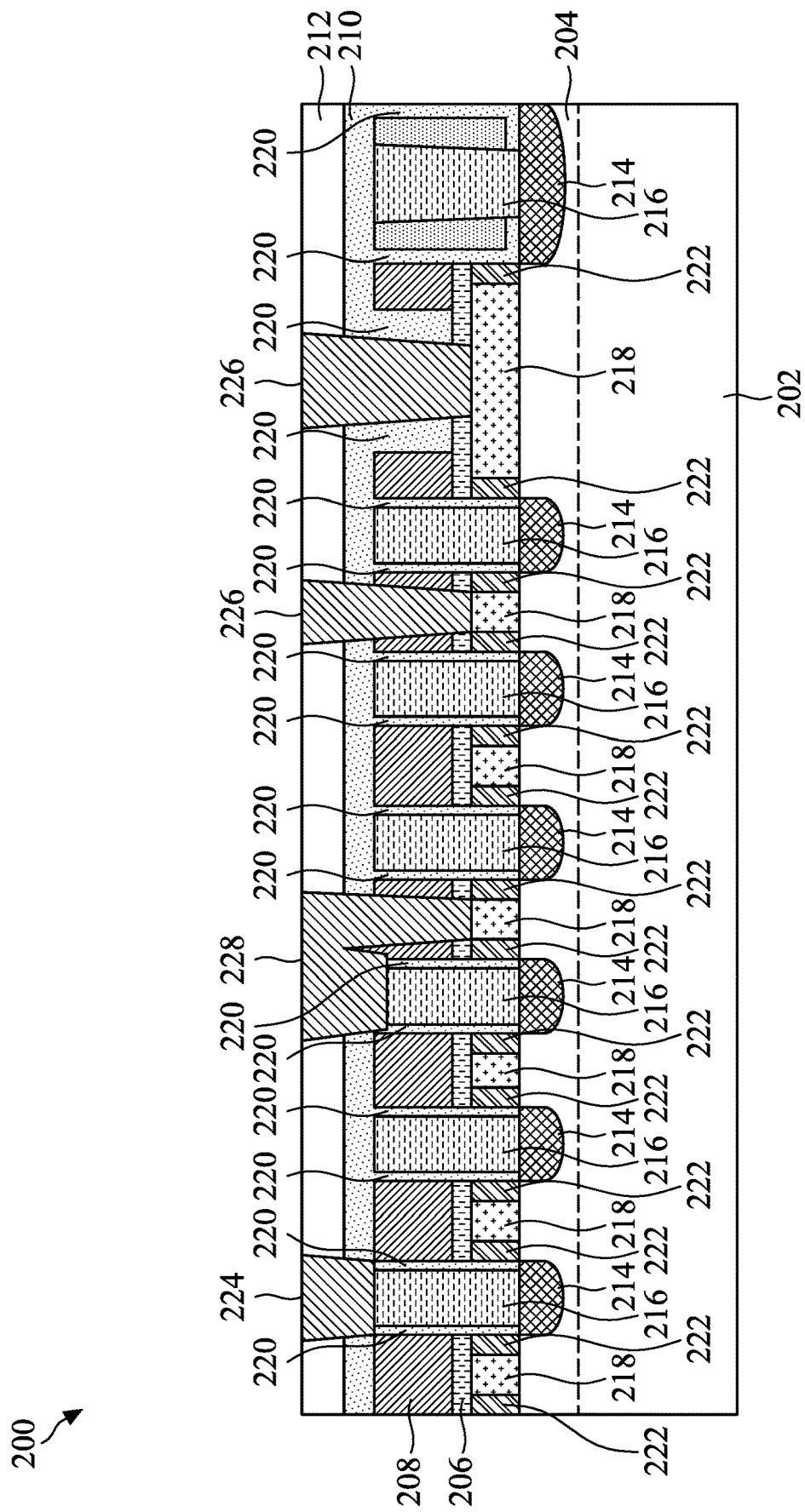
FIG. 2 is a diagram of an example semiconductor device described herein.

FIG. 2 is a diagram of an example semiconductor device 200 described herein. The semiconductor device 200 includes an example of a memory device (e.g., a static random access memory (SRAM), a dynamic random access memory (DRAM)), a logic device, a processor, an input/output device, or another type of semiconductor device that includes one or more transistors.

As shown in FIG. 2, the semiconductor device 200 includes a substrate 202, which includes a silicon (Si) substrate, a substrate formed of a material including silicon, a III-V compound semiconductor material substrate such as gallium arsenide (GaAs), a silicon on insulator (SOI) substrate, or another type of semiconductor substrate. In some implementations, a fin structure 204 is formed in the substrate 202. In this way, the transistors included in the semiconductor device 200 include finFETs. In some implementations, the semiconductor device 200 includes other types of transistors, such as gate all around (GAA) transistors, planar transistors, and/or other types of transistors.

The semiconductor device 200 includes one or more stacked layers, including a capping layer 206, a dielectric layer 208, a middle contact etch stop layer (MCESL) 210, and an oxide layer 212, among other examples. The capping layer 206 may be included over the gates of the transistors of the semiconductor device 200 to electrically insulate the gates from other structures of the semiconductor device 200. The dielectric layer 208 includes a silicon nitride (SiNx), an oxide (e.g., a silicon oxide (SiOx) and/or another oxide material), and/or another type of dielectric material. The MCESL 210 includes a layer of material that is configured to permit various portions of the semiconductor device 200 (or the layers included therein) to be selectively etched or protected from etching to form one or more of the structures included in the semiconductor device 200. The oxide layer 212 includes a silicon oxide (SiOx) and/or another oxide material that functions as a passivation layer in the semiconductor device 200.

As further shown in FIG. 2, the semiconductor device 200 includes a plurality of epitaxial regions 214 that are grown and/or otherwise formed on and/or around a portion of the fin structure 204. The epitaxial regions 214 are formed by epitaxial growth. In some implementations, the epitaxial regions 214 are formed in recessed portions in the fin structure 204. The recessed portions may be formed by strained source drain (SSD) etching of the fin structure 204 and/or another type etching operation. The epitaxial regions 214 function as source or drain regions of the transistors included in the semiconductor device 200.

The epitaxial regions 214 are electrically connected to metal source or drain contacts 216 of the transistors included in the semiconductor device 200. The metal source or drain contacts (or MDs) 216 include cobalt (Co), ruthenium (Ru), and/or another conductive or metal material. The transistors further include gates 218, which are formed of a polysilicon material, a metal (e.g., tungsten (W) or another metal), and/or another type of conductive material. The metal source or drain contacts 216 and the gates 218 are electrically isolated by one or more sidewall spacers, including spacers 220 in each side of the metal source or drain contacts 216 and spacers 222 on each side of the gate 218. The spacers 220 and 222 may include a silicon oxide (SiOx), a silicon nitride ($Si_xN_y$), a silicon oxy carbide (SiOC), a silicon oxycarbonitride (SiOCN), and/or another suitable material.

As further shown in FIG. 2, the metal source or drain contacts 216 and the gates 218 are electrically connected to one or more types of interconnects. The interconnects electrically connect the transistors of the semiconductor device 200 and/or electrically connect the transistors to other areas and/or components of the semiconductor device 200. The metal source or drain contacts 216 are electrically connected to source or drain interconnects 224 (e.g., VDs). One or more of the gates 218 are electrically connected to gate interconnects 226 (e.g., VGs). In some implementations, a metal source or drain contact 216 and a gate 218 are electrically connected by an interconnect called a butted contact (BCT 228). A butted contact includes a combination of a source or drain contact and a gate contact in a singular structure. The various types of interconnects 224, 226, and 228 include a conductive material such as tungsten, cobalt, ruthenium, and/or another type of conductive material.

As indicated above, FIG. 2 is provided as an example. Other examples may differ from what is described with regard to FIG. 2.

Figure 3:
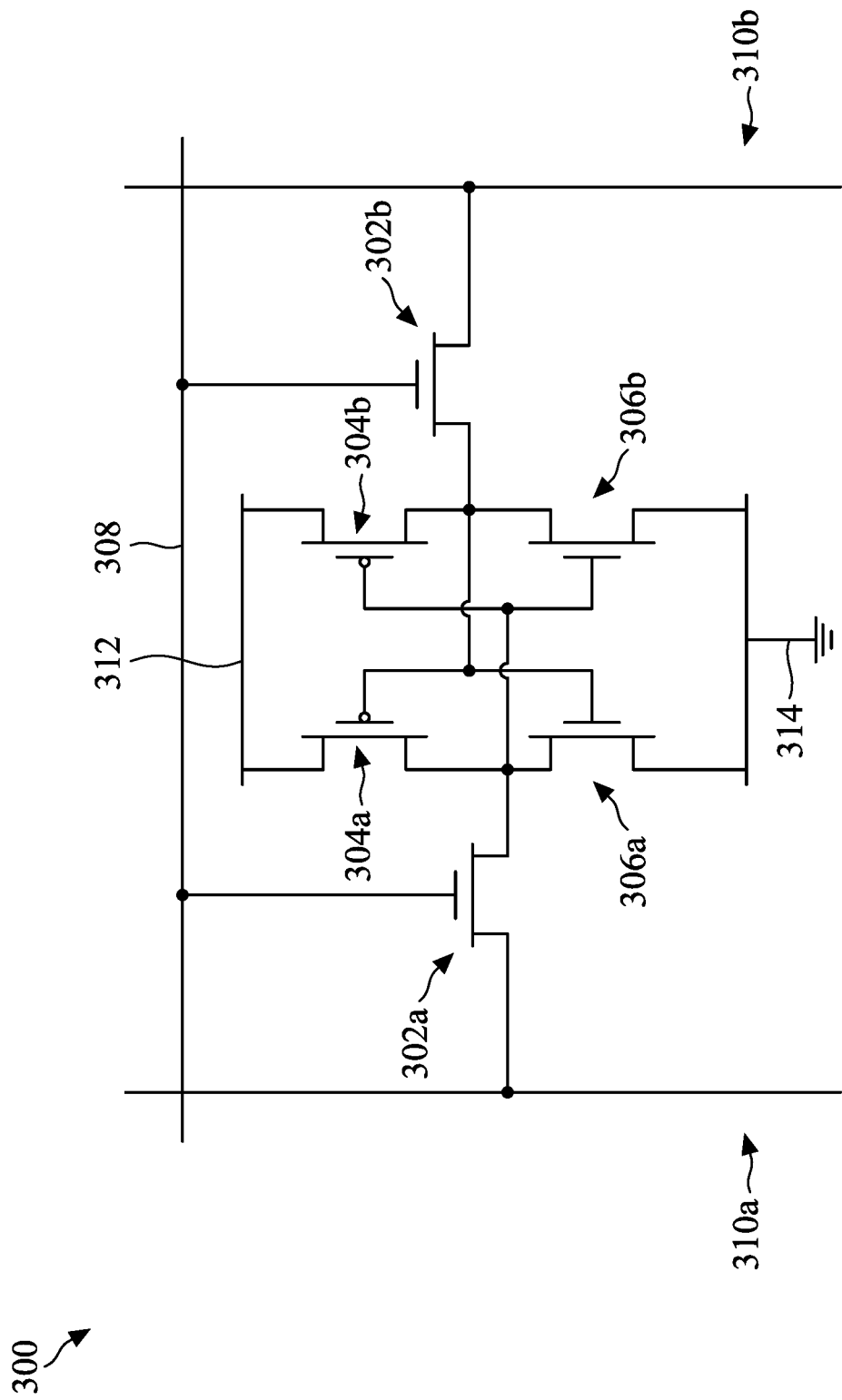
FIG. 3 is a diagram of an example memory cell described herein.

FIG. 3 is a diagram of an example memory cell 300 described herein. The example memory cell 300 includes an example of a 6-transistor (6T) static random access memory (SRAM) cell. The memory cell 300 may be included in the semiconductor device 200 and/or another semiconductor device.

As shown in FIG. 3, the memory cell 300 includes pass-gate transistors 302a and 302b, pull-up transistors 304a and 304b, and pull-down transistors 306a and 306b. The pass-gate transistors 302a and 302b includes n-type metal-oxide semiconductor (NMOS) transistors or p-type metal-oxide semiconductor (PMOS) transistors. The pull-up transistors 304a and 304b include PMOS transistors. The pull-down transistors 306a and 306b include NMOS transistors. In some implementations, the pass-gate transistors 302a and 302b, the pull-up transistors 304a and 304b, and/or pull-down transistors 306a and 306b include finFET transistors described herein. In some implementations, the pass-gate transistors 302a and 302b, the pull-up transistors 304a and 304b, and/or pull-down transistors 306a and 306b include other types of transistors such as GAA transistors and/or planar transistors, among other examples.

The gates of pass-gate transistors 302a and 302b are controlled by a word-line (WL) 308 that is used to select or activate the memory cell 300. The pull-up transistors 304a and 304b, and pull-down transistors 306a and 306b, are electrically connected in a latch configuration to store one or more electronic bits of information. A stored bit can be written into or read from the memory cell through bit lines (BL) 310a and 310b. The memory cell is powered through a positive power supply node ($V_{CC}$ or $V_{dd}$) 312 and power supply node ($V_{SS}$) 314, which may include an electrical ground.

As indicated above, FIG. 3 is provided as an example. Other examples may differ from what is described with regard to FIG. 3.

Figure 4:
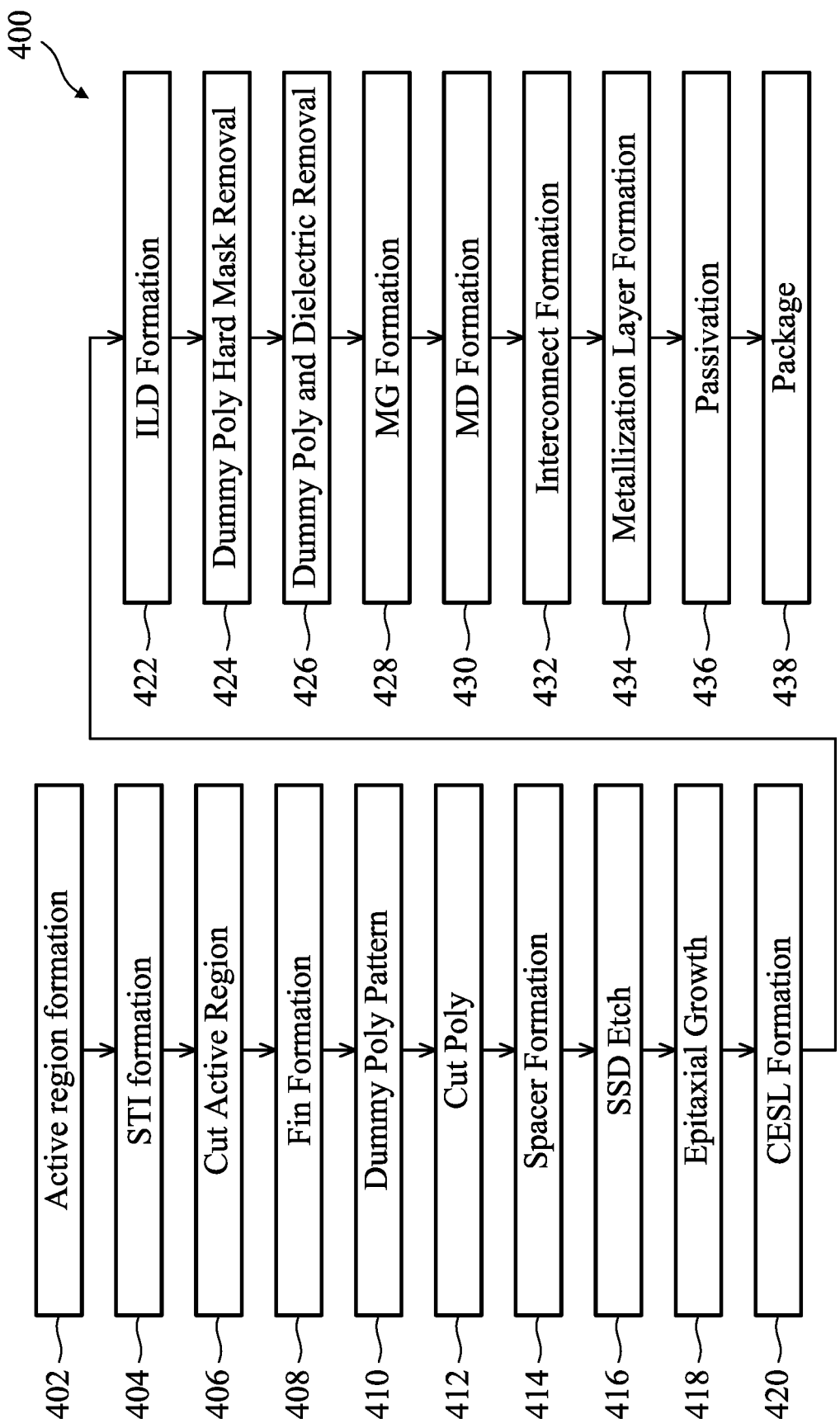
FIG. 4 is a flowchart of an example process relating to forming a semiconductor device described herein.

FIG. 4 is a flowchart of an example process 400 associated with forming a semiconductor device described herein. The semiconductor device may include the semiconductor device 200, the memory cell 300, and/or another semiconductor device that includes a plurality of transistors. In some implementations, one or more of the techniques described herein may be performed as (or as a part of) one or more of the operations described in connection with FIG. 4.

In some implementations, one or more process blocks of FIG. 4 may be performed by one or more of semiconductor processing tools (e.g., one or more of the semiconductor processing tools 102-112). Additionally, or alternatively, one or more process blocks of FIG. 4 may be performed by one or more components of a device (e.g., device 900 (FIG. 9), such as processor 920, memory 930, storage component 940, input component 950, output component 960, and/or communication component 970).

As shown in FIG. 4, process 400 includes forming an active region (or a plurality of active regions) of the semiconductor device (block 402). For example, one or more of the semiconductor processing tools 102-112 may form an active region (or a plurality of active regions) in the substrate 202 of the semiconductor device 200. The active region(s) may include a plurality of fin structures 204 that are formed in the substrate 202.

As further shown in FIG. 4, process 400 includes forming shallow trench isolation (STI) regions between the active regions (block 404). For example, one or more of the semiconductor processing tools 102-112 may form the STI layers between the plurality of fin structures 204 of the semiconductor device 200. The STI layers include dielectric regions that provide electrical isolation between the active regions or fin structures 204.

As further shown in FIG. 4, process 400 includes forming one or more cut active regions in one or more of the active regions of the semiconductor device (block 406). For example, one or more of the semiconductor processing tools 102-112 may form the one or more cut active regions in the semiconductor device 200. The cut active regions may include cut fin regions of the fin structures 204 of the semiconductor device 200. In some implementations, the one or more cut active regions are formed based on one or more of the techniques described in connection with FIGS. 5A-5E and/or based on other techniques described herein.

As further shown in FIG. 4, process 400 includes a fin formation operation (block 408). For example, one or more of the semiconductor processing tools 102-112 may perform the fin formation operation to etch back the STI layers. The etch back of the STI layers reduces the height of the STI layers, which exposes portions of the active regions or fin structures 204 of the semiconductor device 200.

As further shown in FIG. 4, process 400 includes forming a dummy poly pattern (block 410). For example, one or more of the semiconductor processing tools 102-112 may form the dummy poly pattern of the semiconductor device 200. The dummy poly pattern includes forming a plurality of polysilicon layers or (polysilicon regions) of the semiconductor device 200 as part of forming the gates 218 of the semiconductor device 200. The polysilicon layers are formed over portions of the active regions or fin structures 204 and over portions of the STI layers. The polysilicon layers extend in a direction that is approximately perpendicular to the active regions and the STI layers. In some implementations, the polysilicon layers are formed to function as dummy layers for intermediate processing operations prior to formation of the gates 218 (which may include metal gates). This is referred to as a gate last process, in which the dummy polysilicon layers (e.g., dummy polysilicon gates) are initially formed and processing may continue until deposition of interlayer dielectric (ILD) layers. The dummy polysilicon layers are then removed and replaced with metal gates.

As further shown in FIG. 4, process 400 includes forming one or more cut polysilicon regions in one or more of the polysilicon layers of the semiconductor device (block 412). For example, one or more of the semiconductor processing tools 102-112 may form the one or more cut polysilicon regions in the semiconductor device 200. In some implementations, one or more of the polysilicon layers are shared by multiple PMOS and/or NMOS devices of the semiconductor device 200 or the memory cell 300. Accordingly, an operation is performed to separate the one or more polysilicon layers into a plurality of unconnected segments so that each of the PMOS devices and/or the NMOS devices is an independent device in a cell grid having a respective polysilicon layer segment. Thus, the cut polysilicon regions are utilized to cut polysilicon layers shared by a plurality of devices into separate pieces. In some implementations, the one or more cut polysilicon regions are formed based on one or more of the techniques described in connection with FIGS. 6A-6E and/or based on other techniques described herein.

As further shown in FIG. 4, process 400 includes forming the spacers of the semiconductor device (block 414). For example, one or more of the semiconductor processing tools 102-112 may form the spacers 220 and 222 of the semiconductor device 200.

As further shown in FIG. 4, process 400 includes performing a strained source drain (SSD) etch of the active regions to form recesses in portions of the active regions (block 416). For example, one or more of the semiconductor processing tools 102-112 may perform the SSD etch to form recesses in the active regions or fin structures 204 of the semiconductor device 200.

As further shown in FIG. 4, process 400 includes forming epitaxial regions of the semiconductor device by epitaxial growth (block 418). For example, one or more of the semiconductor processing tools 102-112 may form the epitaxial regions 214 of the semiconductor device 200. The epitaxial regions 214 are formed in the recesses in the active regions or fin structures 204 of the semiconductor device 200 and are grown out from the recesses by epitaxial growth. The epitaxial regions 214 are formed as the source or drain regions of the semiconductor device 200.

As further shown in FIG. 4, process 400 includes forming a contact etch stop layer (CESL) of the semiconductor device (block 420). For example, one or more of the semiconductor processing tools 102-112 may form the CESL of the semiconductor device 200. The CESL includes a silicon nitride ($Si_xN_y$), a silicon oxynitride (SiON), and/or another suitable material. The CESL provides an etch stop layer for the formation of source or drain contacts 216 to the epitaxial regions 214.

As further shown in FIG. 4, process 400 includes forming a plurality of interlayer dielectric (ILD) layers (or ILD regions) of the semiconductor device (block 422). For example, one or more of the semiconductor processing tools 102-112 may form the ILD regions in between the plurality of polysilicon layers of the semiconductor device 200. The ILD regions provide electrical isolation between the polysilicon layers of the semiconductor device 200.

As further shown in FIG. 4, process 400 includes removing a hard mask associated with the polysilicon layers (block 424). For example, one or more of the semiconductor processing tools 102-112 may remove the hard mask associated with the polysilicon layers (e.g., the dummy polysilicon gates) from the semiconductor device 200.

As further shown in FIG. 4, process 400 includes a dummy poly and dielectric removal operation (block 426). For example, one or more of the semiconductor processing tools 102-112 may remove the polysilicon layers (e.g., the dummy polysilicon gates) and associated dielectric layers from the semiconductor device 200. As described above, in some implementations, the polysilicon layers (or dummy polysilicon gates) function as placeholder structures prior to the formation of the metal gates (e.g., the gates 218) of the semiconductor device 200. Accordingly, the dummy poly and dielectric removal operation is performed such that the gates 218 can be formed in a subsequent processing operation.

As further shown in FIG. 4, process 400 includes forming the gates (e.g., the MGs) of the semiconductor device (block 428). For example, one or more of the semiconductor processing tools 102-112 may form the gates 218 of the semiconductor device 200.

As further shown in FIG. 4, process 400 includes forming the source/drain contacts (e.g., the MDs) of the semiconductor device (block 430). For example, one or more of the semiconductor processing tools 102-112 may form the source or drain contacts 216 of the semiconductor device 200. The source or drain contacts 216 are formed to electrically connect with the epitaxial regions 214. In some implementations, the source or drain contacts 216 are formed based on one or more of the techniques described in connection with FIGS. 7A-7F and/or based on other techniques described herein.

As further shown in FIG. 4, process 400 includes forming the interconnects of the semiconductor device (block 432). For example, one or more of the semiconductor processing tools 102-112 may form the interconnects 224, 226, and 228 of the semiconductor device 200. The interconnects are formed to the source or drain contacts 216 (e.g., VD interconnects or BCT interconnects) and to the gates 218 (e.g., VG interconnects or BCT interconnects).

As further shown in FIG. 4, process 400 includes forming the back end of line (BEOL) metallization layers of the semiconductor device (block 434). For example, one or more of the semiconductor processing tools 102-112 may form the BEOL metallization layers (e.g., M0, M1) that electrically connect to the interconnects 224, 226, and 228 of the semiconductor device 200.

As further shown in FIG. 4, process 400 includes forming passivation layers of the semiconductor device (block 436). For example, one or more of the semiconductor processing tools 102-112 may form the passivation layers of the semiconductor device 200. The passivation layers may include dielectric layers and/or other types of insulating layers that protect the circuits and metallization layers of the semiconductor device 200.

As further shown in FIG. 4, process 400 includes packaging the semiconductor device (block 438). For example, one or more of the semiconductor processing tools 102-112 and/or other semiconductor processing tools may package the semiconductor device 200 into a device package. The package may include a system in package (SiP), a chip on package (CoP), a package on package (PoP), or another type of semiconductor package.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

FIGS. 5A-5E are diagrams of an example implementation 500 described herein. The example implementation 500 includes an example of forming one or more cut active regions in a semiconductor device, such as the semiconductor device 200 and/or the memory cell 300, among other examples. In some implementations, the operations described in connection with FIGS. 5A-5E are performed as part of a process of forming a semiconductor device, such as the process described in connection with FIG. 4. In some implementations, the operations described in connection with FIGS. 5A-5E are performed as part of the cut active region operation (block 406) described in connection with FIG. 4.

Figure 5A:
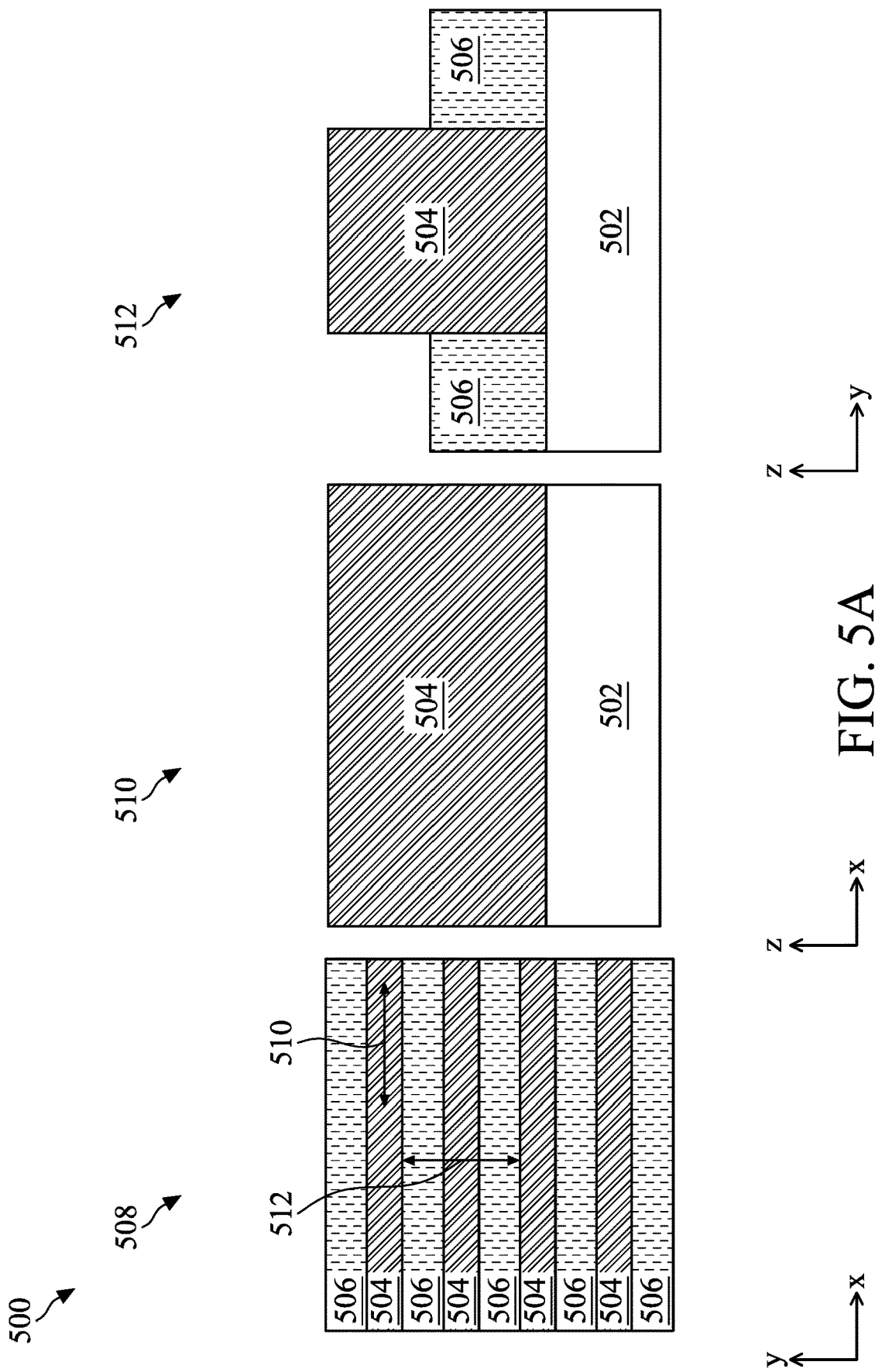
FIGS. 5A-5E, 6A-6E, 7A-7F, and 8A-8D are diagrams of example implementations described herein.

As shown in FIG. 5A, the semiconductor device includes a substrate 502 (e.g., the substrate 202 of the semiconductor device 200), a plurality of active region layers 504 (e.g., fin structures 204 of the semiconductor device 200), and a plurality of STI layers 506. As shown in a top-down view 508 of the semiconductor device, the active region layers 504 and the STI layers 506 extend along a first direction (e.g., an x-direction). Moreover, the active region layers 504 and the STI layers 506 are arranged in an alternating pattern in the semiconductor device 200.

FIG. 5A further shows a cross-sectional view 510 of a portion of the semiconductor device along an active region layer 504 in the first direction (e.g., the x-direction) and a cross-sectional view 512 across the active region layer 504 and a plurality of STI layers 506 in a second direction (e.g., the y-direction) that is approximately perpendicular to the first direction. As shown in the cross-sectional views 510 and 512, the active region layers 504 and the STI layers 506 are included over and/or on the substrate 502.

In some implementations, the width of an active region layer 504 along the short dimension of the active region layer 504 (e.g., along the y-direction) is in a range of approximately 5 nanometers to approximately 200 nanometers based on process capability and semiconductor device size parameters. However, other values for the width of the active region layer 504 are within the scope of the present disclosure. In some implementations, the width of an STI layer 506 along the short dimension of the STI layer 506 (e.g., along the y-direction) is in a range of approximately 8 nanometers to approximately 200 nanometers based on process capability and the spacing between active region layers 504. However, other values for the width of the STI layer 506 are within the scope of the present disclosure.

As further shown in FIG. 5A (e.g., in the cross-sectional view 512), the STI layers 506 are lower or shorter than the height of the active region layers 504. In some implementations, the STI layers 506 and the active region layers 504 are formed to a same or similar height. Subsequently, a process is performed to recess or etch back the STI layers 506 to expose portions of the active region layers 504, as shown in the cross-sectional view 512 in FIG. 5A.

Figure 5B:
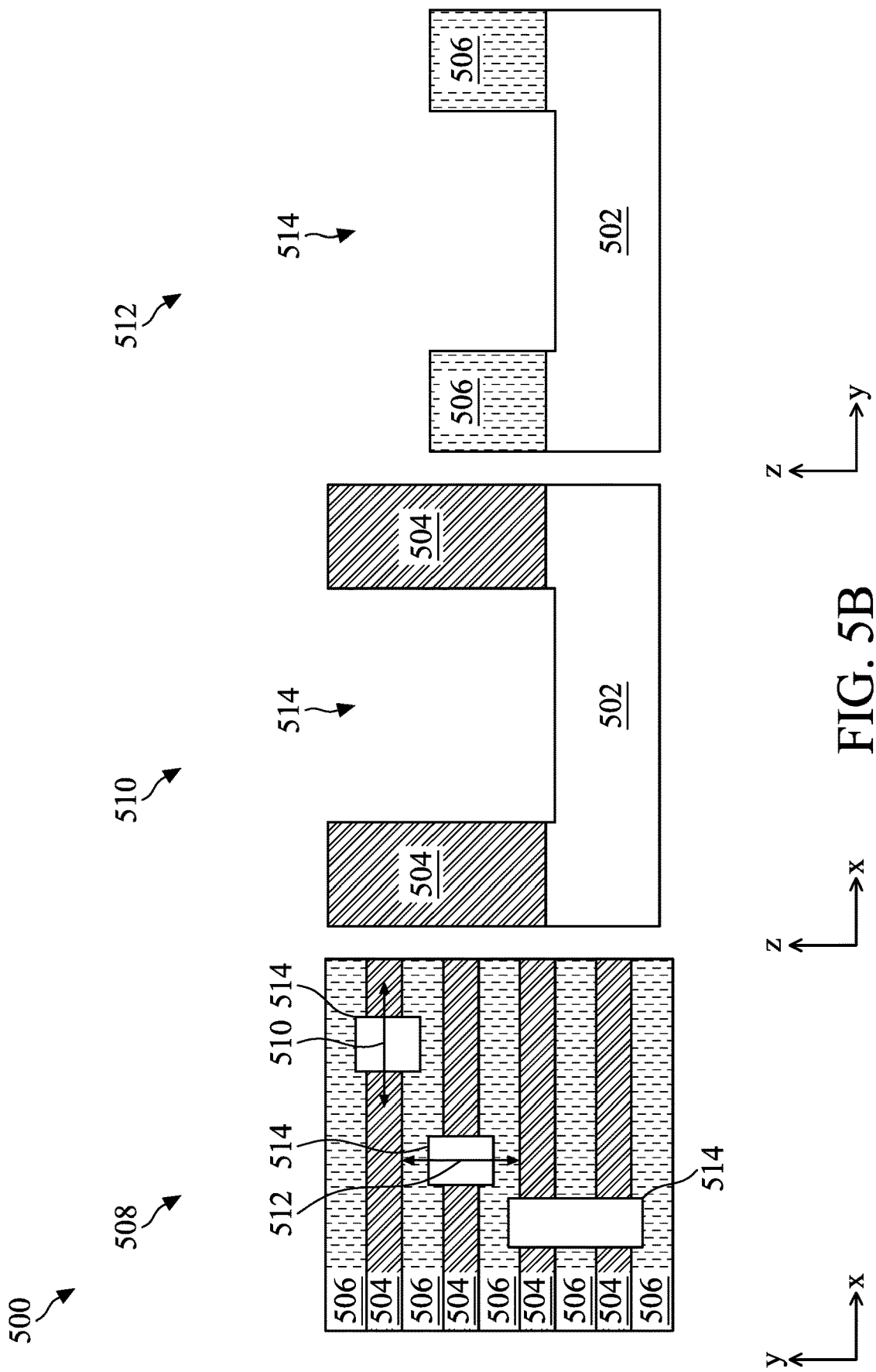

As shown in FIG. 5B, a plurality of recesses (or openings) 514 are formed through portions of one or more of the active region layers 504 and through portions of a plurality of the STI layers 506. In some implementations, the recesses 514 are formed into a portion of the substrate 502. The recesses 514 include recesses in which cut active regions are to be formed for the semiconductor device.

In some implementations, a pattern in a photoresist layer is used to form the recesses 514. In these implementations, the deposition tool 102 forms the photoresist layer on the active region layers 504 and on the STI layers 506. The exposure tool 104 exposes the photoresist layer to a radiation source to pattern the photoresist layer. The developer tool 106 develops and removes portions of the photoresist layer to expose the pattern. The etch tool 108 etches through the portions of the active region layer(s) 504, through the portions of the STI layers 506, and into a portion of the substrate 502 to form the recesses 514. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 514 based on a pattern.

Figure 5C:
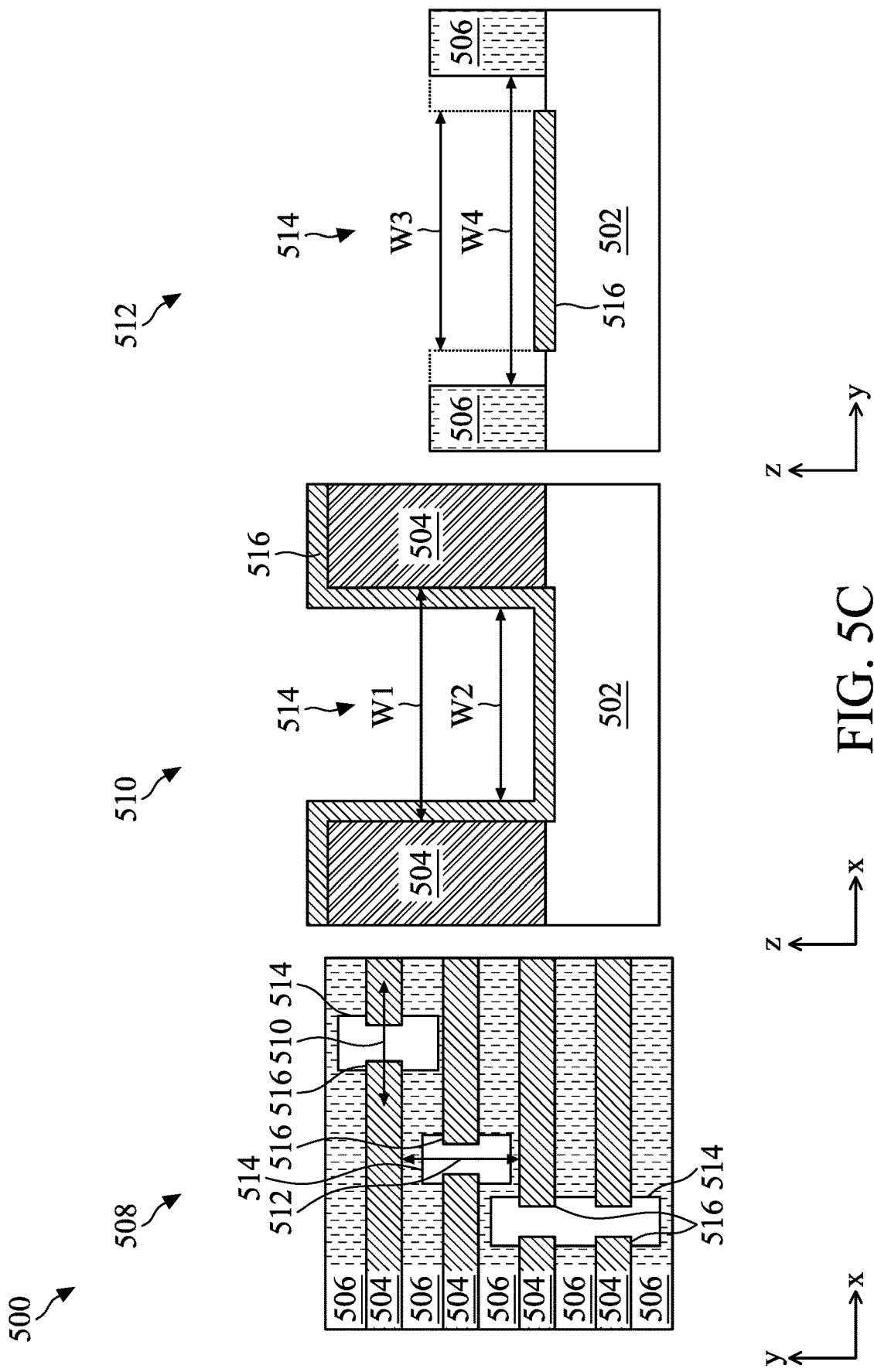

As shown in FIG. 5C, a layer 516 is formed in the recesses 514. In particular, the layer 516 is deposited on the bottom surfaces of the recesses 514 (e.g., on the substrate 502 in the recesses 514) and on the active region layer 504 sidewall portions of the recesses 514. In other words, the layer 516 forms or grows on the portions of the sidewalls of the recesses 514 that are formed by the active region layer(s) 504. The deposition tool 102 deposits the layer 516 by a CVD technique, or a in-situ deposition step in etcher, a deposition technique described above in connection with FIG. 1, and/or another deposition technique.

As shown in the cross-sectional view 510 in FIG. 5C, the formation of the layer 516 on the portions of the sidewalls of the recesses 514 that are formed by the active region layer(s) 504 results in a reduction in the width of the recesses 514 between portions of the active region layer(s) 504. This reduction in width between portions of the active region layer(s) 504 enables the reduction in cell sizes of memory cells that are formed in the semiconductor device. This, in turn, enables increased memory cell density for the semiconductor device and increased device performance for the semiconductor device.

In some implementations, the initial width (W1) of a recess 514 along an active region layer 504 between portions of the active region layer 504 is in a range of approximately 12 nanometers to approximately 220 nanometers, and the width (W2) of the recess 514 along the active region layer 504 between the portions of the active region layer 504 after deposition of the layer 516 is in a range of approximately 10 nanometers to approximately 200 nanometers based on process capability, to achieve a particular size for the memory cells (or other circuit structures) of the semiconductor device, and/or to reduce the risk of bridging between adjacent cut active regions. However, other values for the initial width (W1) and the width (W2) after deposition of the layer 516 are within the scope of the present disclosure. In some implementations, the thickness of the layer 516 is in a range of approximately 1 nanometer to approximately 10 nanometers to sufficiently reduce the initial width (W1).

The layer 516 includes a tungsten carbide ($W_xC_y$), a boron nitride ($B_xN_y$), a boron carbide ($B_xC$), a boron oxide ($B_xO_y$), a fluorocarbon ($C_xF_y$) polymer, and/or another material that is capable of depositing and growing on the active region layer(s) 504. In some implementations, the layer 516 includes boron nitride ($B_xN_y$), and the layer 516 is formed by depositing boron chloride ($BCl_3$) onto the substrate 502 and onto the active region layers 504 (including portions of the sidewalls of the recesses 514 that include the active region layers 504). The boron chloride bonds to the surfaces of the substrate 502 and the active region layer 504. The surfaces of the substrate 502 and the active region layer 504 are then treated with a nitrogen ($N_2$) plasma to form the boron nitride layer 516.

In some implementations, the layer 516 includes a tungsten carbide ($WC_x$), which is formed by depositing a tungsten fluoride precursor (e.g., tungsten hexafluoride ($WF_6$) or another tungsten fluoride). The tungsten fluoride reacts with a hydrofluorocarbon ($CH_xF_y$, such as difluoromethane ($CH_2F_2$) to form the tungsten carbide. The tungsten carbide is formed as a non-volatile byproduct deposition layer onto the active region layers 504.

As shown in the cross-sectional view 512 in FIG. 5C, the deposition operation of the and deposit on layer 516 causes the sidewall portions of the recesses 514 that include the STI layers 506 to be etched such that material of the sidewall portions of the recesses 514 that include the STI layers 506 is removed. In some implementations, the boron chloride ($BCl_3$) contacts and reacts with the oxide material of the STI layers 506. The reaction between the oxygen of the oxide material and the boron chloride results in the formation of a volatile by-product boron chloride oxide (BClO), which causes a width of the recesses 514 to increase between STI layers 506. This increases the y-direction width of the recesses 514 (e.g., the width of the recesses 514 across the active region layers 504 and the STI layers 506), which increases the cut active region formation process window.

In implementations where tungsten carbide is used, the $WF_x$ contacts and reacts with the oxide material of the STI layers 506. The reaction between the oxygen of the oxide material and the $WF_x$ results in the formation of a volatile by-product tungsten(VI) oxytetrafluoride ($WOF_4$), which causes a width of the recesses 514 to increase between STI layers 506. This increases the y-direction width of the recesses 514 (e.g., the width of the recesses 514 across the active region layers 504 and the STI layers 506), which increases the cut active region formation process window. The tungsten carbide that is formed on the active region layers 504 is subsequently removed (e.g., by etching or another removal technique) before the cut material is deposited into the recesses 514. This is due to tungsten carbide being a poor dielectric material. In implementations where fluorocarbon ($C_xF_y$) polymer is used, a small amount of the fluorocarbon ($C_xF_y$) polymer can remain in the recesses 514 due to fluorocarbon ($C_xF_y$) polymer being a good dielectric material.

In some implementations, the initial width (W3) of a recess 514 across an active region layer 504 and between STI layers 506 is in a range of approximately 6 nanometers to approximately 205 nanometers, and the width (W4) of the recess 514 across the active region layer 504 and between the STI layers 506 after the deposition operation of the layer 516 is in a range of approximately 8 nanometers to approximately 215 nanometers based on process capability, to achieve a particular size for the memory cells (or other circuit structures) of the semiconductor device, and/or to reduce the risk of bridging between adjacent cut active regions. However, other values for the initial width (W3) and the width (W4) after the deposition operation are within the scope of the present disclosure.

Figure 5D:
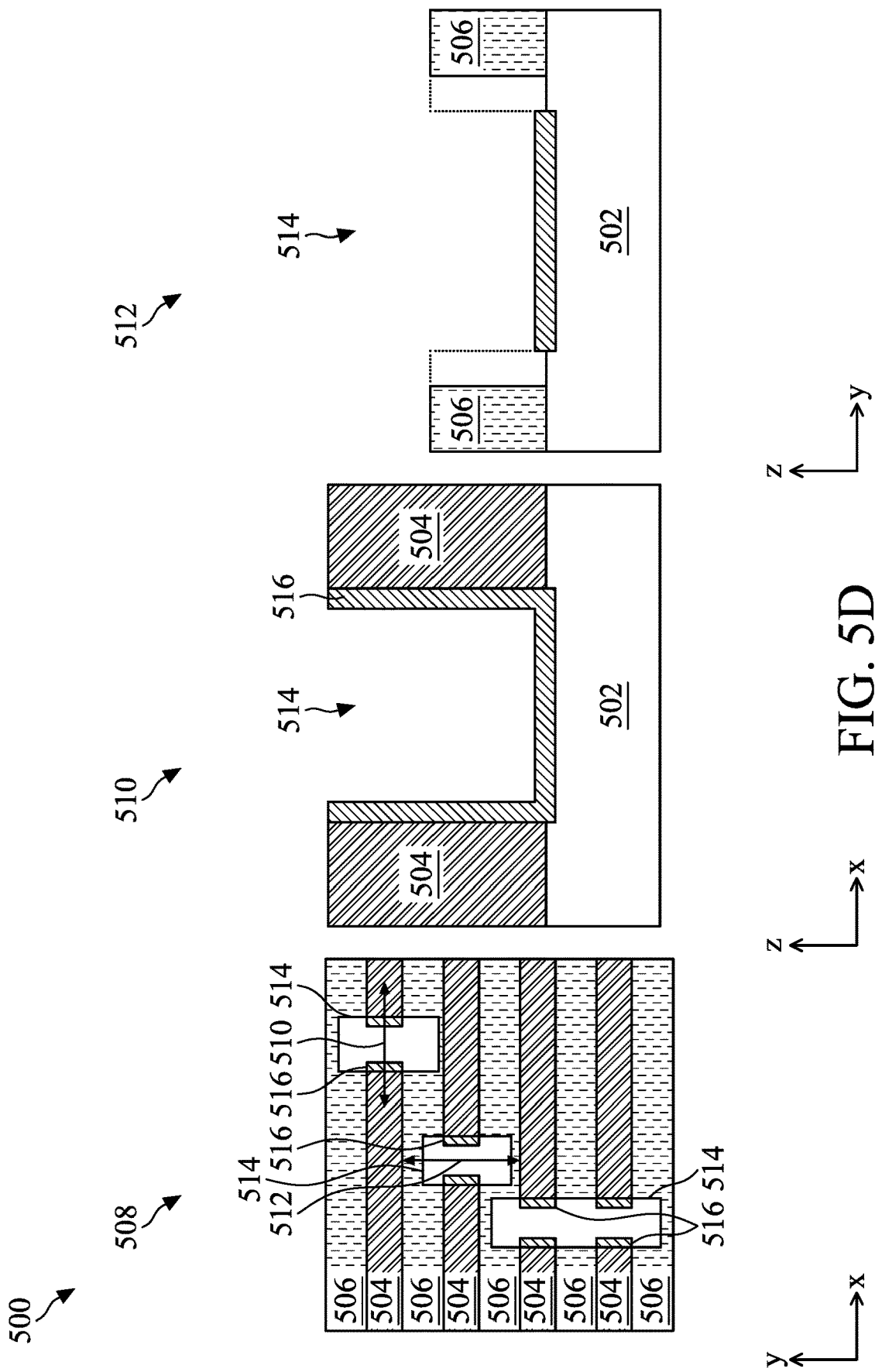

As shown in FIG. 5D, excess or residual material of the layer 516 is removed from the top surfaces of the active region layers 504. In some implementations, the etch tool 108 or the planarization tool 110 performs a planarization or polishing operation to remove the excess or residual material of the layer 516 from the top surfaces of the active region layers 504.

Figure 5E:
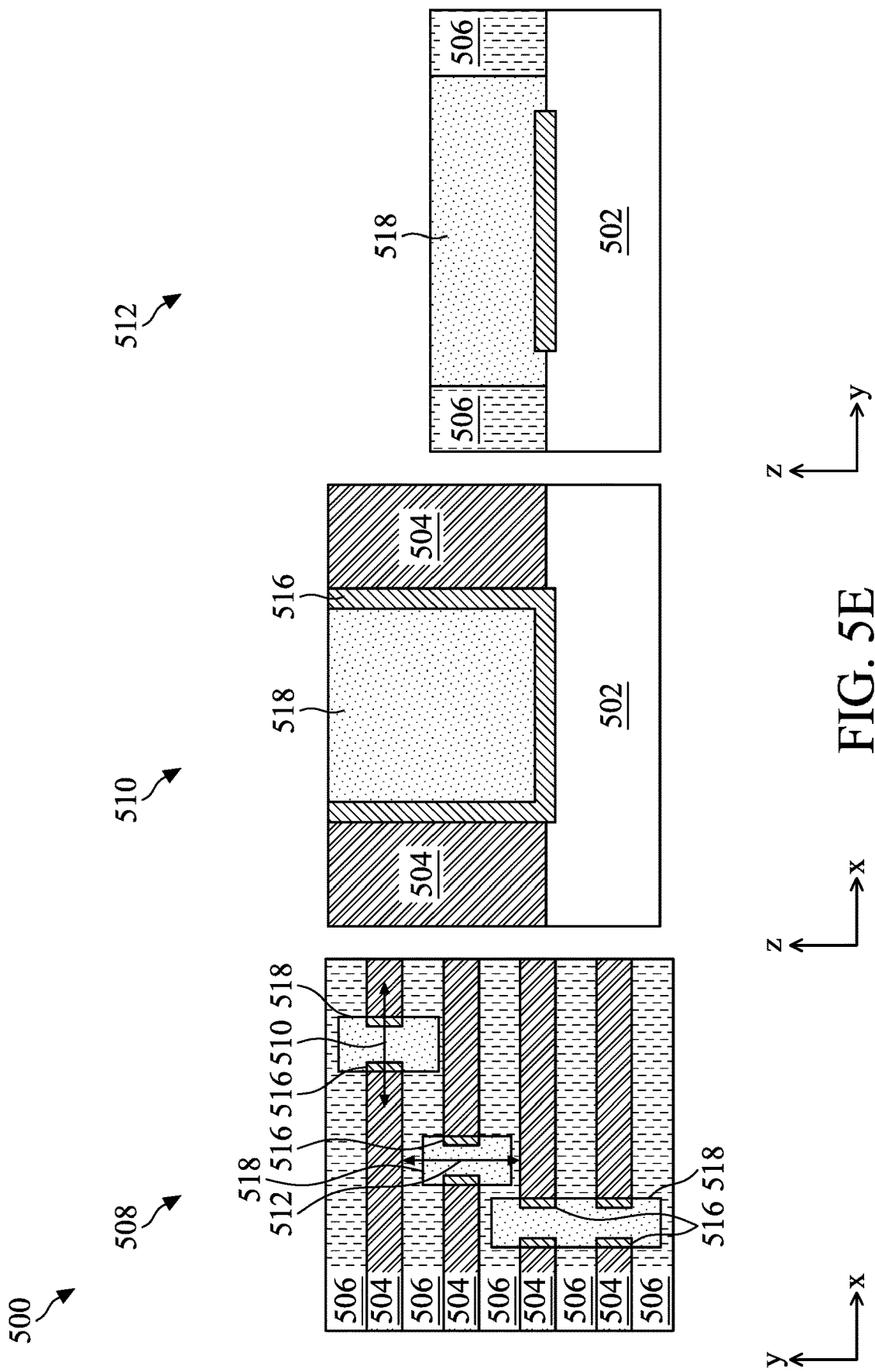

As shown in FIG. 5E, the recesses 514 are filled with a dielectric layer to form a plurality of cut active regions 518 in the recess 514 over the layer 516 for the semiconductor device. The cut active regions 518 may be referred to as fin cut regions 518 or fin cut isolation regions 518. The dielectric layer may include an oxide, a nitride, and/or another type of dielectric material. In some implementations, the deposition tool 102 deposits the dielectric layer to form the cut active regions 518 (or fin cut isolation regions 518) in the recesses 514 by a CVD technique, a PECVD technique, an ALD technique, a deposition technique described above in connection with FIG. 1, and/or another deposition technique. The layer 516 is included between the cut active regions 518 (or fin cut isolation regions 518) and adjacent active region layers 504 (or adjacent active regions) that extend in the same direction (as shown in the top-down view 508). In some implementations, the layer 516 is also included under the cut active regions 518 (or fin cut isolation regions 518) (e.g., between the cut active regions 518 (or fin cut isolation regions 518) and the substrate 502).

As indicated above, FIGS. 5A-5E are provided as an example. Other examples may differ from what is described with regard to FIG. 5A-5E.

FIGS. 6A-6E are diagrams of an example implementation 600 described herein. The example implementation 600 includes an example of forming one or more cut polysilicon regions in a semiconductor device, such as the semiconductor device 200 and/or the memory cell 300, among other examples. In some implementations, the operations described in connection with FIGS. 6A-6E are performed as part of a process of forming a semiconductor device, such as the process described in connection with FIG. 4. In some implementations, the operations described in connection with FIGS. 6A-6E are performed as part of the cut polysilicon region operation (block 412) described in connection with FIG. 4.

Figure 6A:
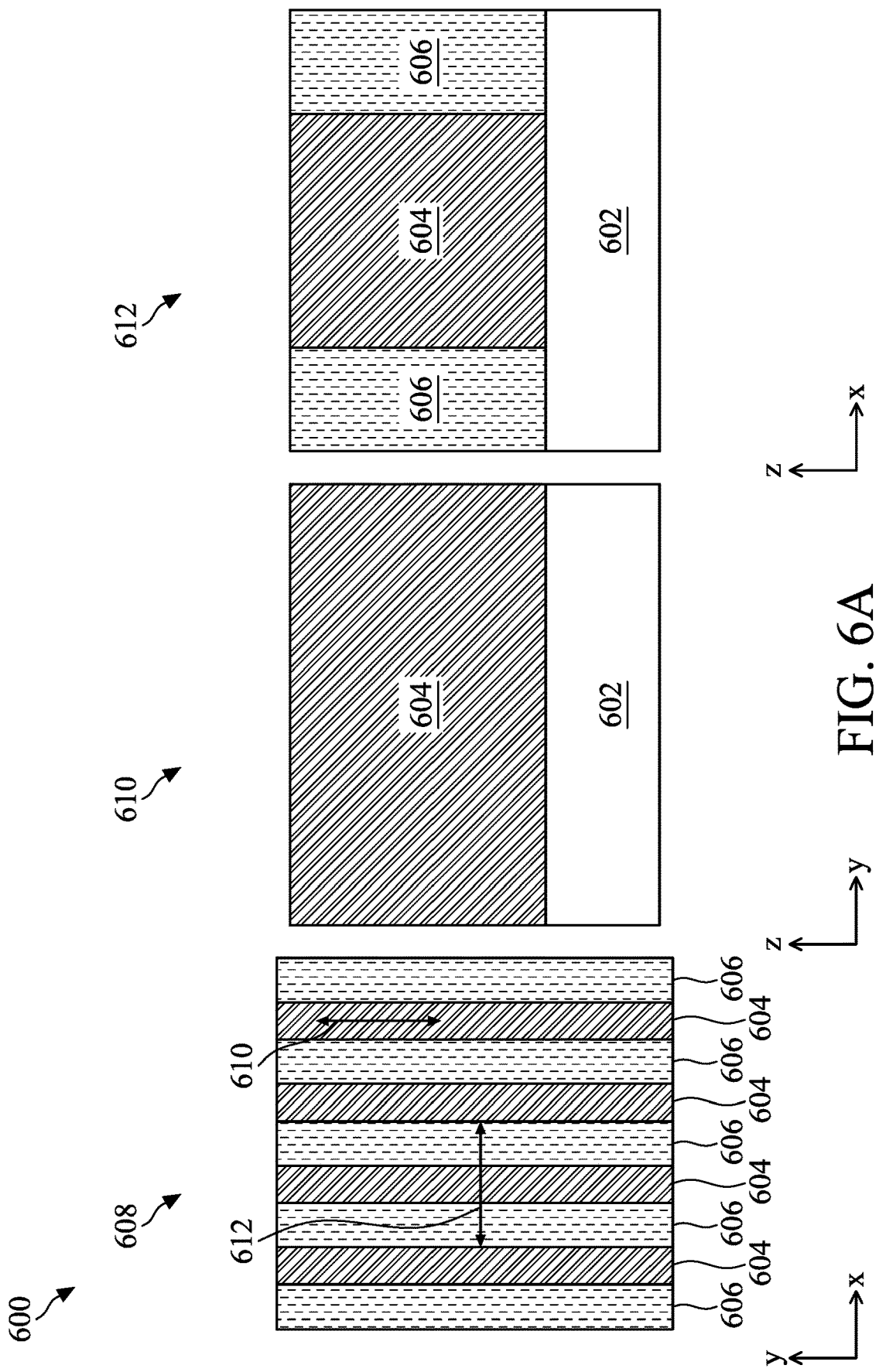

As shown in FIG. 6A, the semiconductor device includes a substrate 602 (e.g., the substrate 202 of the semiconductor device 200), a plurality of polysilicon layers 604 (e.g., gates 218 or dummy gates of the semiconductor device 200), and a plurality of dielectric layers 606 (e.g., dielectric layers 208 and/or other dielectric layers of the semiconductor device 200). The dielectric layers 606 include oxide-containing dielectric layers or another type of dielectric layer. As shown in a top-down view 608 of the semiconductor device, the polysilicon layers 604 and the dielectric layers 606 extend along a first direction (e.g., the y-direction). Moreover, the polysilicon layers 604 and the dielectric layers 606 are arranged in an alternating pattern in the semiconductor device.

FIG. 6A further shows a cross-sectional view 610 of a portion of the semiconductor device along a polysilicon layer 604 in the first direction (e.g., the y-direction) and a cross-sectional view 612 across the polysilicon layer 604 and a plurality of dielectric layers 606 in a second direction (e.g., the x-direction) that is approximately perpendicular to the first direction. As shown in the cross-sectional views 610 and 612, the polysilicon layers 604 and the dielectric layers 606 are included over and/or on the substrate 602. In some implementations, polysilicon layers 604 and the dielectric layers 606 are formed on other structures and/or layers of the semiconductor device, such as the active region layers, the STI layers, and/or the cut active regions, among other examples.

In some implementations, the width of a polysilicon layer 604 along the short dimension of the polysilicon layer 604 (e.g., along the x-direction) is in a range of approximately 8 nanometers to approximately 200 nanometers based on process capability and semiconductor device size parameters. However, other values for the width of the polysilicon layer 604 are within the scope of the present disclosure. In some implementations, the width of an dielectric layer 606 along the short dimension of the dielectric layer 606 (e.g., along the x-direction) is in a range of approximately 15 nanometers to approximately 200 nanometers based on process capability and the spacing between polysilicon layers 604. However, other values for the width of the dielectric layers 606 are within the scope of the present disclosure.

Figure 6B:
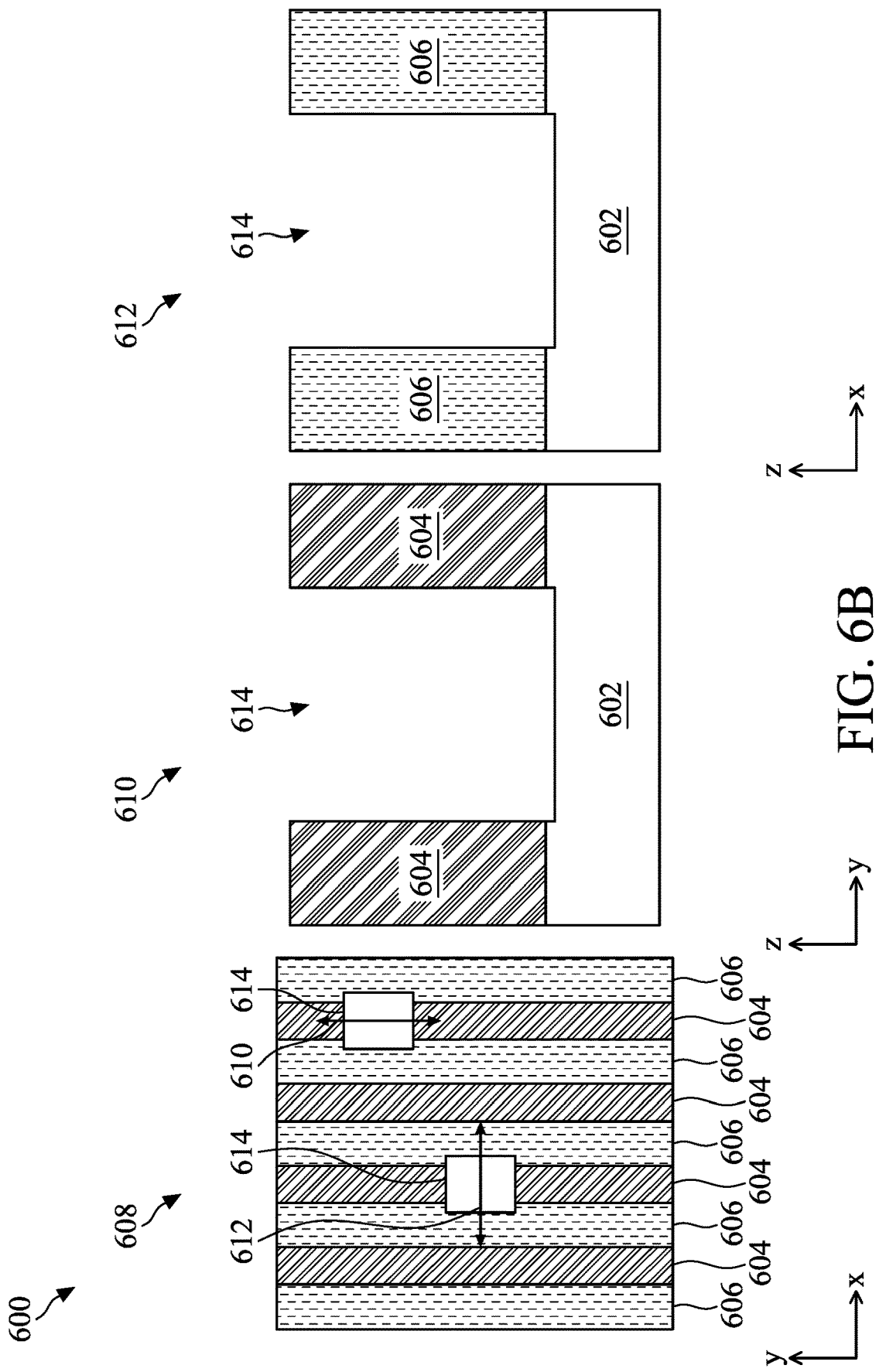

As shown in FIG. 6B, a plurality of recesses (or openings) 614 are formed through portions of one or more of the polysilicon layers 604 and through portions of a plurality of the dielectric layers 606. In some implementations, the recesses 614 are formed into a portion of the substrate 602. The recesses 614 include recesses in which cut polysilicon regions are to be formed for the semiconductor device.

In some implementations, a pattern in a photoresist layer is used to form the recesses 614. In these implementations, the deposition tool 102 forms the photoresist layer on the polysilicon layers 604 and on the dielectric layers 606. The exposure tool 104 exposes the photoresist layer to a radiation source to pattern the photoresist layer. The developer tool 106 develops and removes portions of the photoresist layer to expose the pattern. The etch tool 108 etches through the portions of the polysilicon layer(s) 604, through the portions of the dielectric layers 606, and into a portion of the substrate 602 to form the recesses 614. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 614 based on a pattern.

Figure 6C:
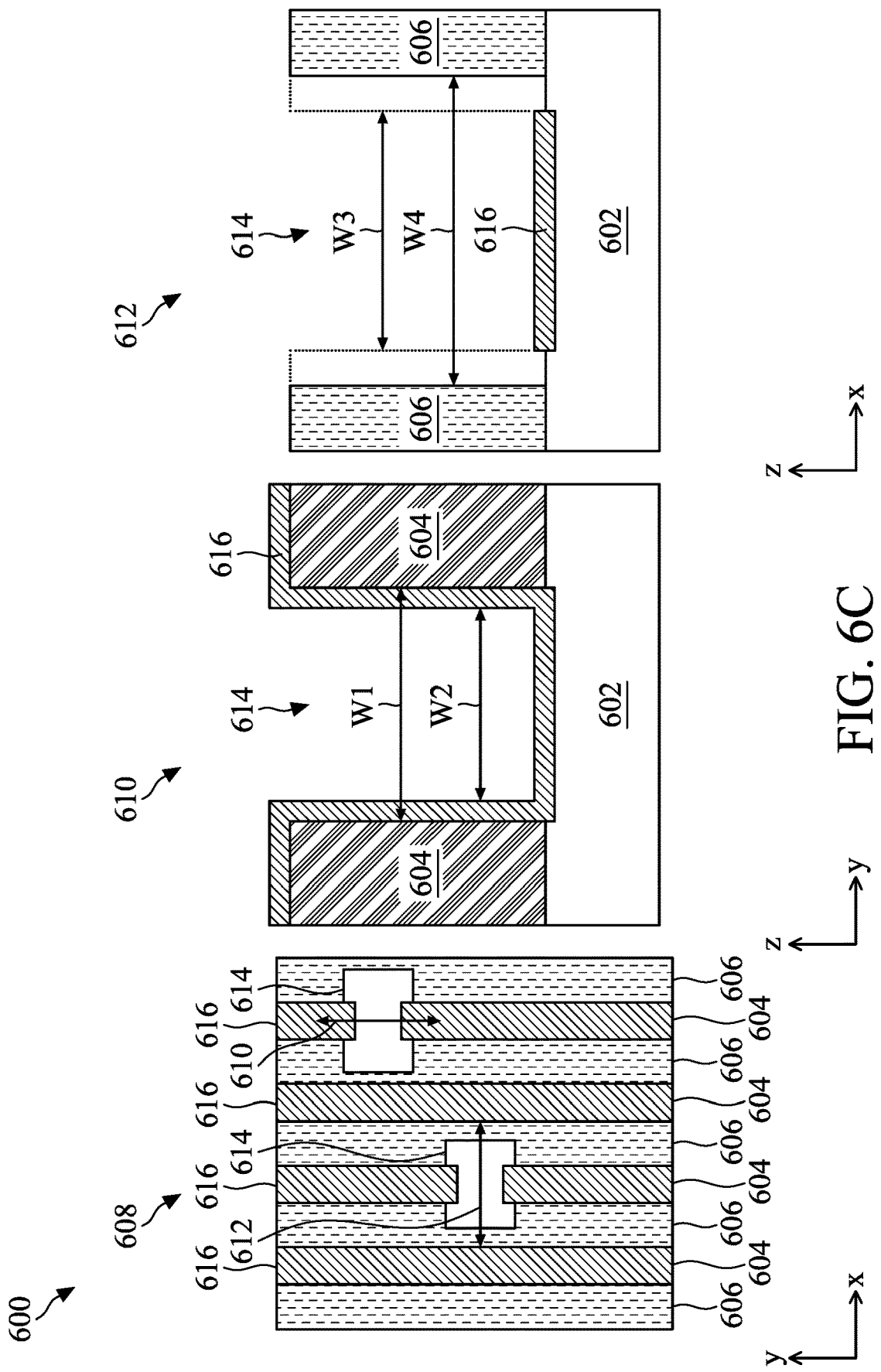

As shown in FIG. 6C, a layer 616 is formed in the recesses 614. In particular, the layer 616 is deposited on the bottom surfaces of the recesses 614 (e.g., on the substrate 602 in the recesses 614) and on the polysilicon layer 604 sidewall portions of the recesses 614. In other words, the layer 616 forms or grows on the portions of the sidewalls of the recesses 614 that are formed by the polysilicon layer(s) 604. The deposition tool 102 deposits the layer 616 by a CVD technique, a in-situ deposition step in etcher, a deposition technique described above in connection with FIG. 1, and/or another deposition technique.

As shown in the cross-sectional view 610 in FIG. 6C, the formation of the layer 616 on the portions of the sidewalls of the recesses 614 that are formed by the polysilicon layer(s) 604 results in a reduction in the width of the recesses 614 between portions of the polysilicon layer(s) 604. This reduction in width between portions of the polysilicon layer(s) 604 enables the reduction in cell sizes of memory cells that are formed in the semiconductor device. This, in turn, enables increased memory cell density for the semiconductor device and increased device performance for the semiconductor device.

In some implementations, the initial width (W1) of a recess 614 along a polysilicon layer 604 between portions of the polysilicon layer 604 is in a range of approximately 12 nanometers to approximately 220 nanometers, and the width (W2) of the recess 614 along the polysilicon layer 604 between the portions of the polysilicon layer 604 after deposition of the layer 616 is in a range of approximately 10 nanometers to approximately 200 nanometers based on process capability, to achieve a particular size for the memory cells (or other circuit structures) of the semiconductor device, and/or to reduce the risk of bridging between adjacent cut polysilicon regions. However, other values for the initial width (W1) and the width (W2) after deposition of the layer 616 are within the scope of the present disclosure. In some implementations, the thickness of the layer 616 is in a range of approximately 1 nanometer to approximately 10 nanometers to sufficiently reduce the initial width (W1).

The layer 616 includes a tungsten carbide ($W_xC_y$), a boron nitride ($B_xN_y$), a boron carbide ($B_xC$), a boron oxide ($B_xO_y$), a fluorocarbon ($C_xF_y$) polymer, and/or another material that is capable of depositing and growing on the polysilicon layer(s) 604. In some implementations, the layer 616 includes boron nitride ($B_xN_y$), and the layer 616 is formed by depositing boron chloride ($BCl_3$) onto the substrate 602 and onto the polysilicon layers 604 (including portions of the sidewalls of the recesses 614 that include the polysilicon layers 604). The boron chloride bonds to the surfaces of the substrate 602 and the polysilicon layer 604. The surfaces of the substrate 602 and the polysilicon layer 604 are then treated with a nitrogen ($N_2$) plasma to form the boron nitride layer 616.

In some implementations, the layer 616 includes a tungsten carbide ($WC_x$), which is formed by depositing a tungsten fluoride precursor (e.g., tungsten hexafluoride ($WF_6$) or another tungsten fluoride). The tungsten fluoride reacts with a hydrofluorocarbon ($CH_xF_y$ such as difluoromethane ($CH_2F_2$) to form the tungsten carbide. The tungsten carbide is formed as a non-volatile byproduct deposition layer onto the polysilicon layers 604.

As shown in the cross-sectional view 612 in FIG. 6C, the deposition operation of the layer 616 causes the sidewall portions of the recesses 614 that include the dielectric layers 606 to be etched such that material of the sidewall portions of the recesses 614 that include the dielectric layers 606 is removed. In some implementations, the boron chloride contacts and reacts with the oxide material of the dielectric layers 606. The reaction between the oxygen of the oxide material and the boron chloride results in the formation of a volatile by-product boron chloride oxide (BClO), which is causes a width of the recesses 614 to increase between dielectric layers 606. This increases the x-direction width of the recesses 614, which increases the cut polysilicon region formation process window.

In some implementations, the $WF_x$ contacts and reacts with the oxide material of the dielectric layers 606. The reaction between the oxygen of the oxide material and the $WF_x$ results in the formation of a volatile by-product $WOF_4$, which is causes a width of the recesses 614 to increase between dielectric layers 606. This increases the x-direction width of the recesses 614 (e.g., the width of the recesses 614 across the polysilicon layers 604 and across the dielectric layers 606), which increases the cut polysilicon region formation process window. The tungsten carbide that is formed on the polysilicon layers 604 is subsequently removed (e.g., by etching or another removal technique) before the cut material is deposited into the recesses 614. This is due to tungsten carbide being a poor dielectric material. In implementations where fluorocarbon ($C_xF_y$) polymer is used, a small amount of the fluorocarbon ($C_xF_y$) polymer can remain in the recesses 614 due to fluorocarbon (CxFy) polymer being a good dielectric material.

In some implementations, the initial width (W3) of a recess 614 across a polysilicon layer 604 and between dielectric layers 606 is in a range of approximately 10 nanometers to approximately 220 nanometers, and the width (W4) of the recess 614 across the polysilicon layer 604 and between the dielectric layers 606 after the deposition operation of the layer 616 is in a range of approximately 15 nanometers to approximately 225 nanometers based on process capability, to achieve a particular size for the memory cells (or other circuit structures) of the semiconductor device, and/or to reduce the risk of bridging between adjacent cut polysilicon regions. However, other values for the initial width (W3) and the width (W4) after the deposition operation are within the scope of the present disclosure.

Figure 6D:
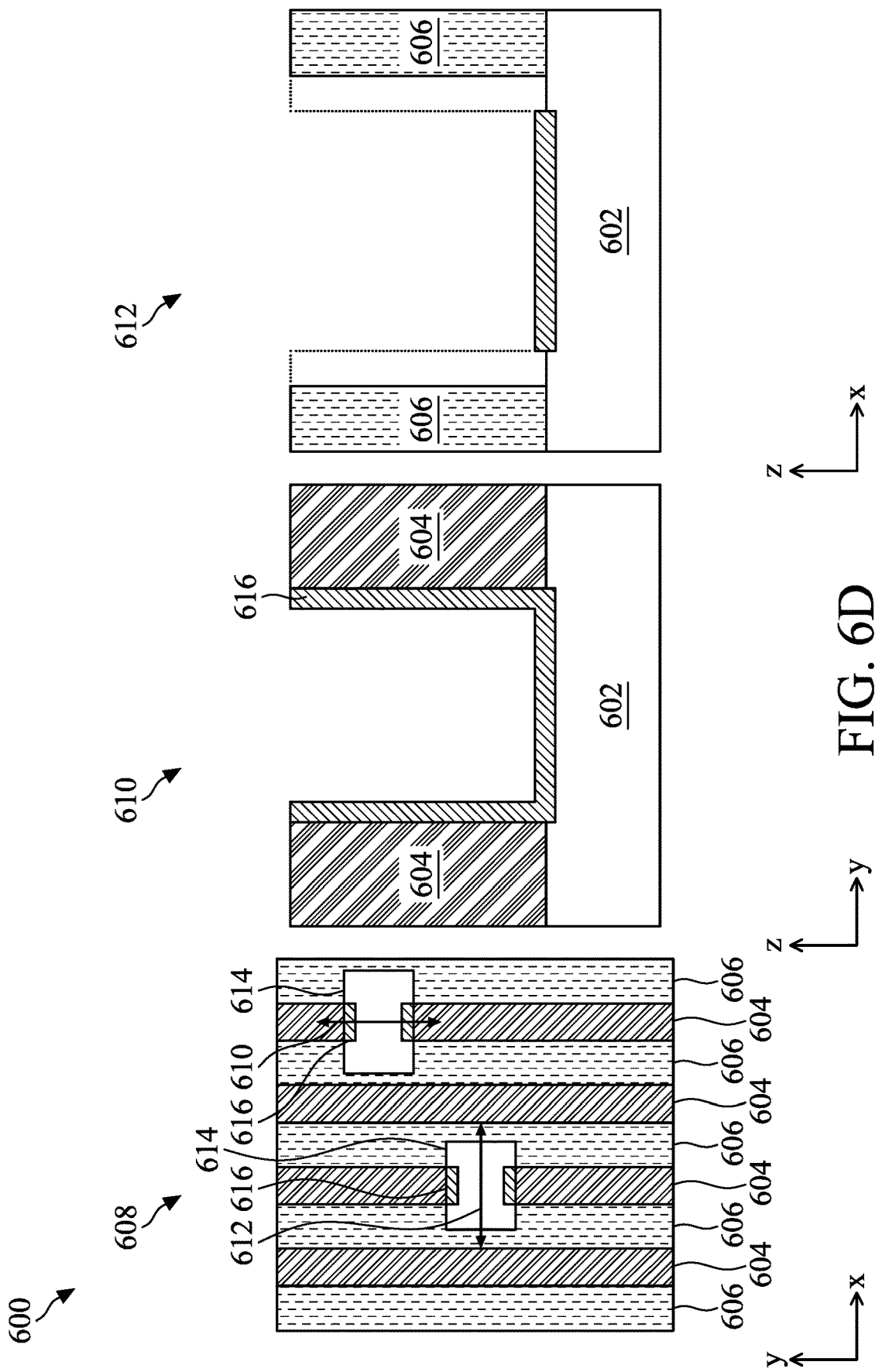

As shown in FIG. 6D, excess or residual material of the layer 616 is removed from the top surfaces of the polysilicon layers 604. In some implementations, the etch tool 108 or the planarization tool 110 performs a planarization or polishing operation to remove the excess or residual material of the layer 616 from the top surfaces of the polysilicon layers 604.

Figure 6E:
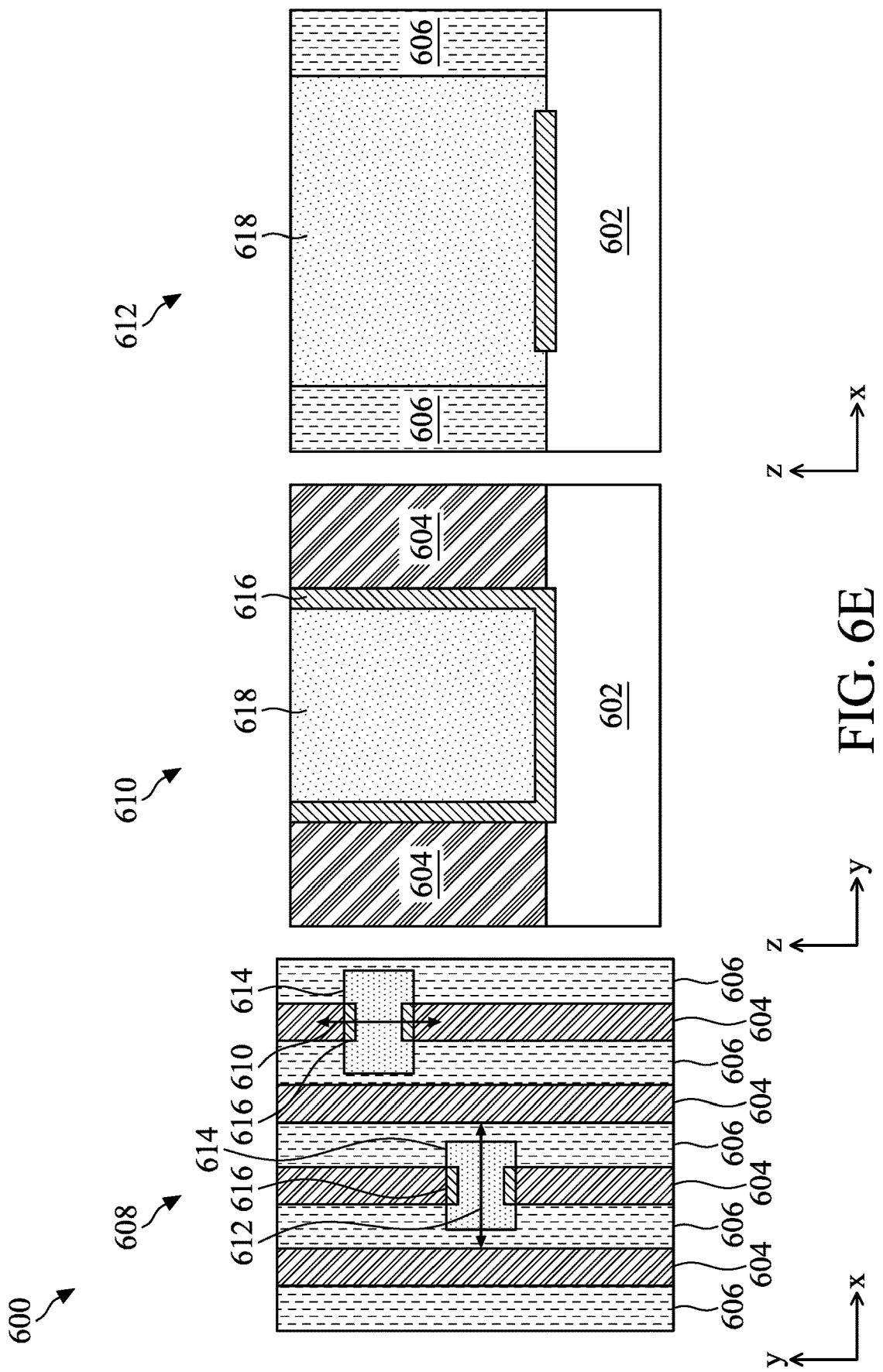

As shown in FIG. 6E, the recesses 614 are filled with a dielectric layer to form a plurality of cut polysilicon regions 618 in the recess 614 over the layer 616 for the semiconductor device. The cut polysilicon regions 618 may be referred to as gate cut isolation regions 618 or gate isolation regions 618. The dielectric layer may include an oxide, a nitride, and/or another type of dielectric material. In some implementations, the deposition tool 102 deposits the dielectric layer to form the cut polysilicon regions 618 (or gate cut isolation regions 618 or gate isolation regions 618) in the recesses 614 by a CVD technique, a PECVD technique, an ALD technique, a deposition technique described above in connection with FIG. 1, and/or another deposition technique. The layer 616 is included between the cut polysilicon regions 618 (or gate cut isolation regions 618 or gate isolation regions 618) and adjacent polysilicon layers 604 (or adjacent poly silicon regions) that extend in the same direction (as shown in the top-down view 608). In some implementations, the layer 616 is also included under the cut polysilicon regions 618 (or gate cut isolation regions 618 or gate isolation regions 618) (e.g., between the cut polysilicon regions 618 (or gate cut isolation regions 618 or gate isolation regions 618) and the substrate 602).

As indicated above, FIGS. 6A-6E are provided as an example. Other examples may differ from what is described with regard to FIG. 6A-6E.

FIGS. 7A-7F are diagrams of an example implementation 700 described herein. The example implementation 700 includes an example of forming one or more source or drain contacts (e.g., one or more source or drain contacts 216) in a semiconductor device, such as the semiconductor device 200 and/or the memory cell 300, among other examples. In some implementations, the operations described in connection with FIGS. 7A-7F are performed as part of a process of forming a semiconductor device, such as the process described in connection with FIG. 4. In some implementations, the operations described in connection with FIGS. 7A-7F are performed as part of the source/drain contact (MD) formation operation (block 430) described in connection with FIG. 4.

Figure 7A:
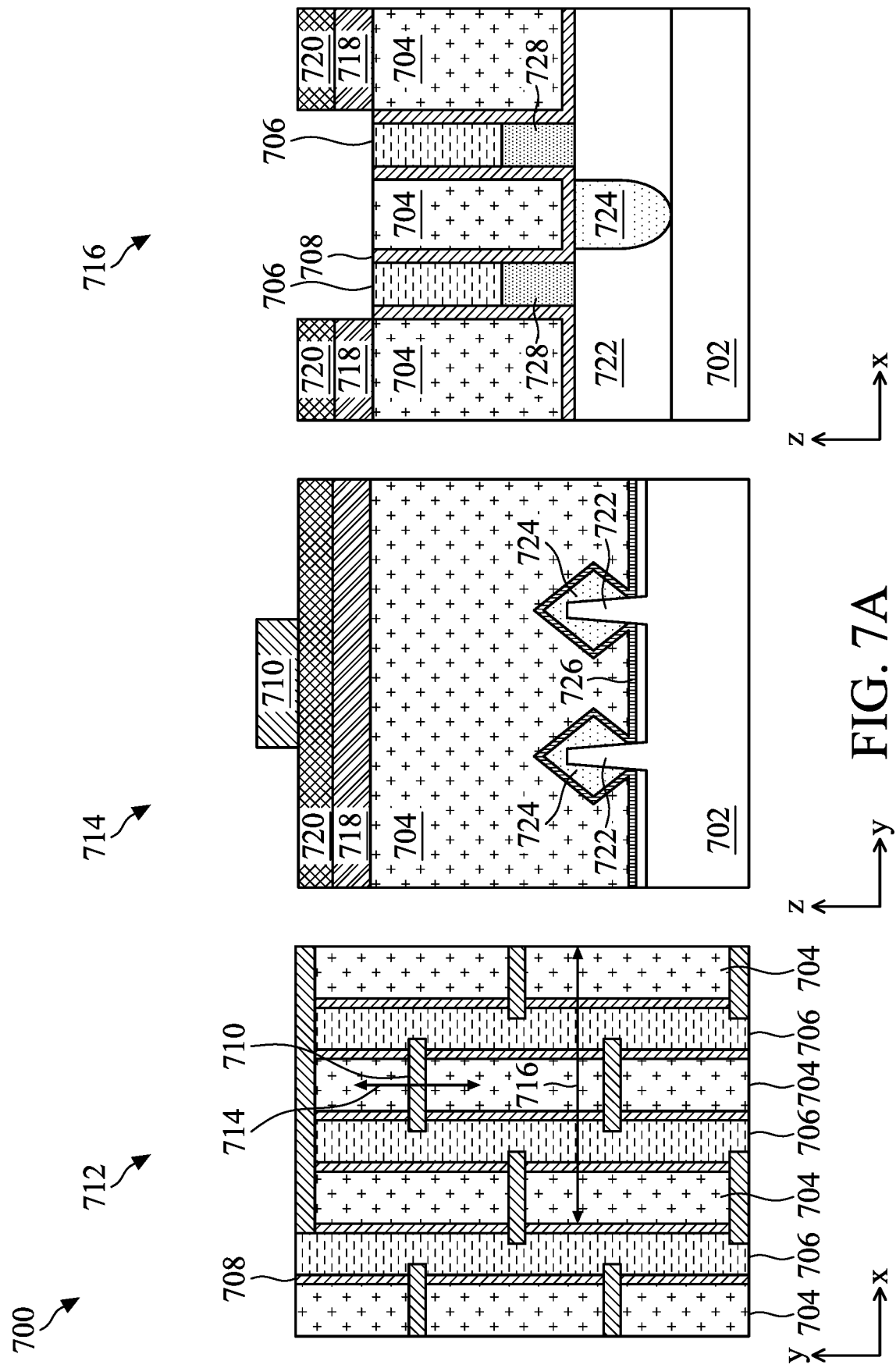

As shown in FIG. 7A, the semiconductor device includes a substrate 702 (e.g., the substrate 202 of the semiconductor device 200), a plurality of ILD layers 704 (e.g., dielectric layers 208 and/or other dielectric layers of the semiconductor device 200), a plurality of sacrificial layer structures (SACs) 706, a plurality of spacers 708, and a plurality of cut metal drain (CMD) regions 710.

As shown in a top-down view 712 of the semiconductor device, the ILD layers 704, the SACs 706, and the spacers 708 extend along a first direction (e.g., the y-direction). The ILD layers 704 and the SACs 706 are arranged in an alternating pattern in the semiconductor device, where the spacers 708 are included between adjacent ILD layers 704 and SACs 706. As further shown in the top-down view 712, the CMD regions 710 are arranged approximately perpendicular above and/or over the ILD layers 704, the SACs 706, and the spacers 708. The CMD regions 710 extend in a second direction (e.g., the x-direction). The CMD regions 710 may also be referred to as contact end cuts and may be used to etch the ILD layers 704 in preparation for forming source or drain contacts of the semiconductor device.

FIG. 7A further shows a cross-sectional view 714 of a portion of the semiconductor device along an ILD layer 704 in the first direction (e.g., the y-direction) and a cross-sectional view 716 across the ILD layer 704 and a plurality of SACs 706 in a second direction (e.g., the x-direction) that is approximately perpendicular to the first direction. As shown in the cross-sectional views 714 and 716, the ILD layers 704, the SACs 706, the spacers 708, and the CMD regions 710 are included over the substrate 702. In some implementations, the ILD layers 704, the SACs 706, the spacers 708, and the CMD regions 710 are formed on other structures and/or layers of the semiconductor device, such as the active region layers, the STI layers, and/or the cut active regions, among other examples.

As further shown in the cross-sectional views 714 and 716, the semiconductor device includes one or more hard mask layers 718 and/or 720 that are used for etching various layers to form one or more structures of the semiconductor device. The CMD regions 710 are included over and/or on the one or more hard mask layers 718 and/or 720. Fin structures 722 (e.g., fin structures 204 of the semiconductor device 200) are formed in the substrate 702 and are at least partially surrounded by epitaxial regions 724 (e.g., epitaxial regions 214 of the semiconductor device 200). The epitaxial regions 724 are lined with a bottom contrast enhancement layer (BCEL) 726, which may include a polymer and a solvent, among other examples. As shown in the cross-sectional view 716, the SACs 706 are included over and/or on the gates 728. The sacrificial layer structures (SACs) 706 include are used for fabricating the epitaxial regions 724 such that the epitaxial regions 724 may be arranged closer to the gates 728 (e.g., which allows for decreased sizes of the semiconductor devices 200 included therein). The SACs 706 may be fabricated by patterning the ILD layers 704. The SACs 706 may include a nitride, which creates good etching selectivity relative to the ILD layers 704. The etch selectivity improves the epitaxial region 724 process window. In some implementations, the SACs 706 may include gate cap insulating layers. Adjacent gates 728 may be electrically isolated by the gate isolation regions 618. Thus, the layer 616 (e.g., the boron nitride layer or a similar type of layer) is included between a gate isolation region 618 and a first gate 728, and between the gate isolation region 618 and a second gate 728, where the first gate 728 and the second gate 728 extend in a same direction.

Figure 7B:
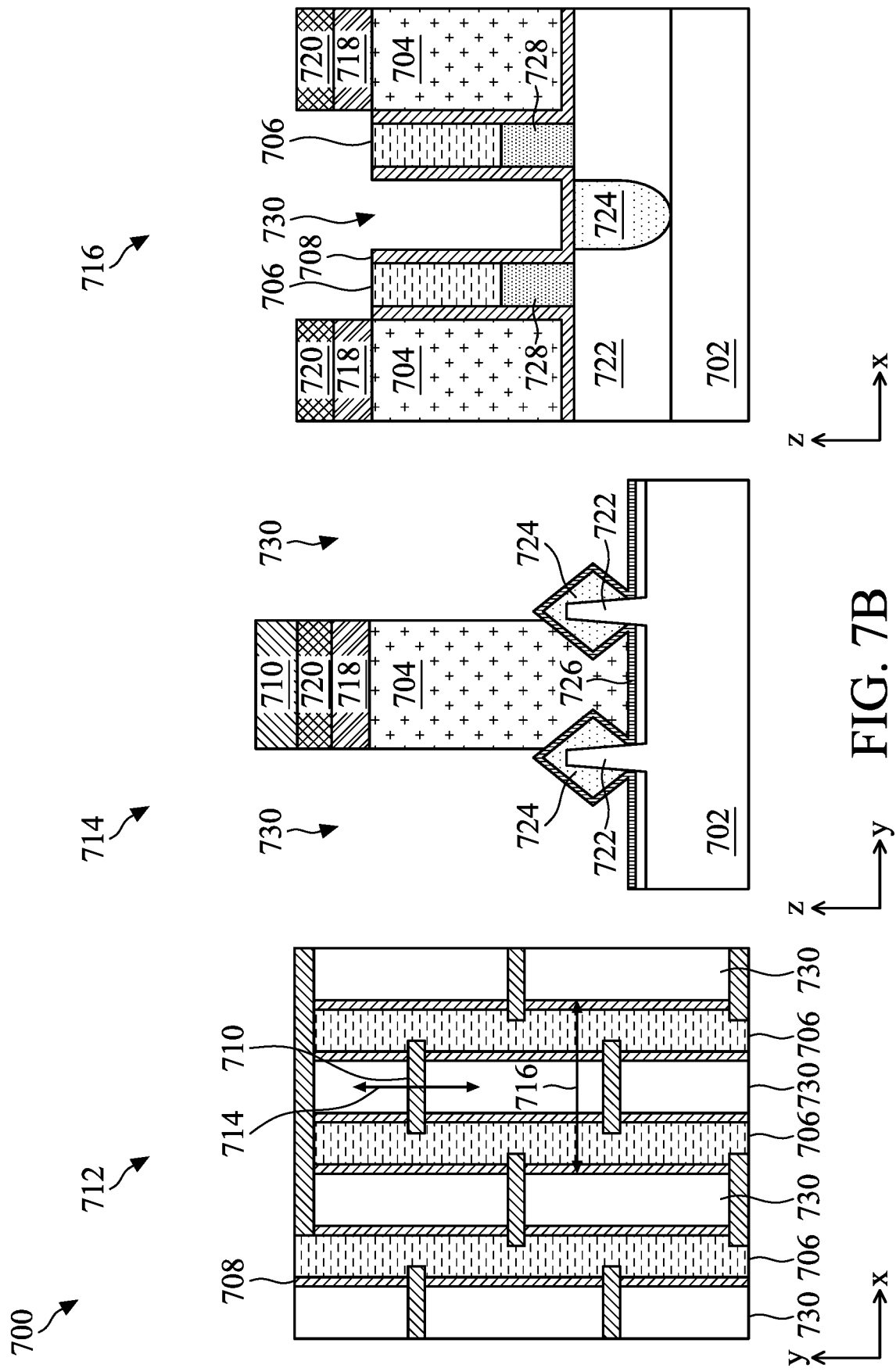

As shown in FIG. 7B, the portions of the ILD layers 704 between the CMD regions 710 are etched down to the spacers 708 over the epitaxial regions 724 and to the BCELs 726 on the epitaxial regions 724. The etch tool 108 etches recesses (or openings) 730 into and/or through the portions of the ILD layers 704 based on the one or more hard mask layers 718 and 720, the CMD regions 710, and/or a pattern in a photoresist layer that is formed over and/or on the ILD layers 704. The remaining portions of the ILD layers 704 under the CMD regions 710 provide electrical isolation between source or drain contacts that are to be formed in adjacent recesses 730.

Figure 7C:
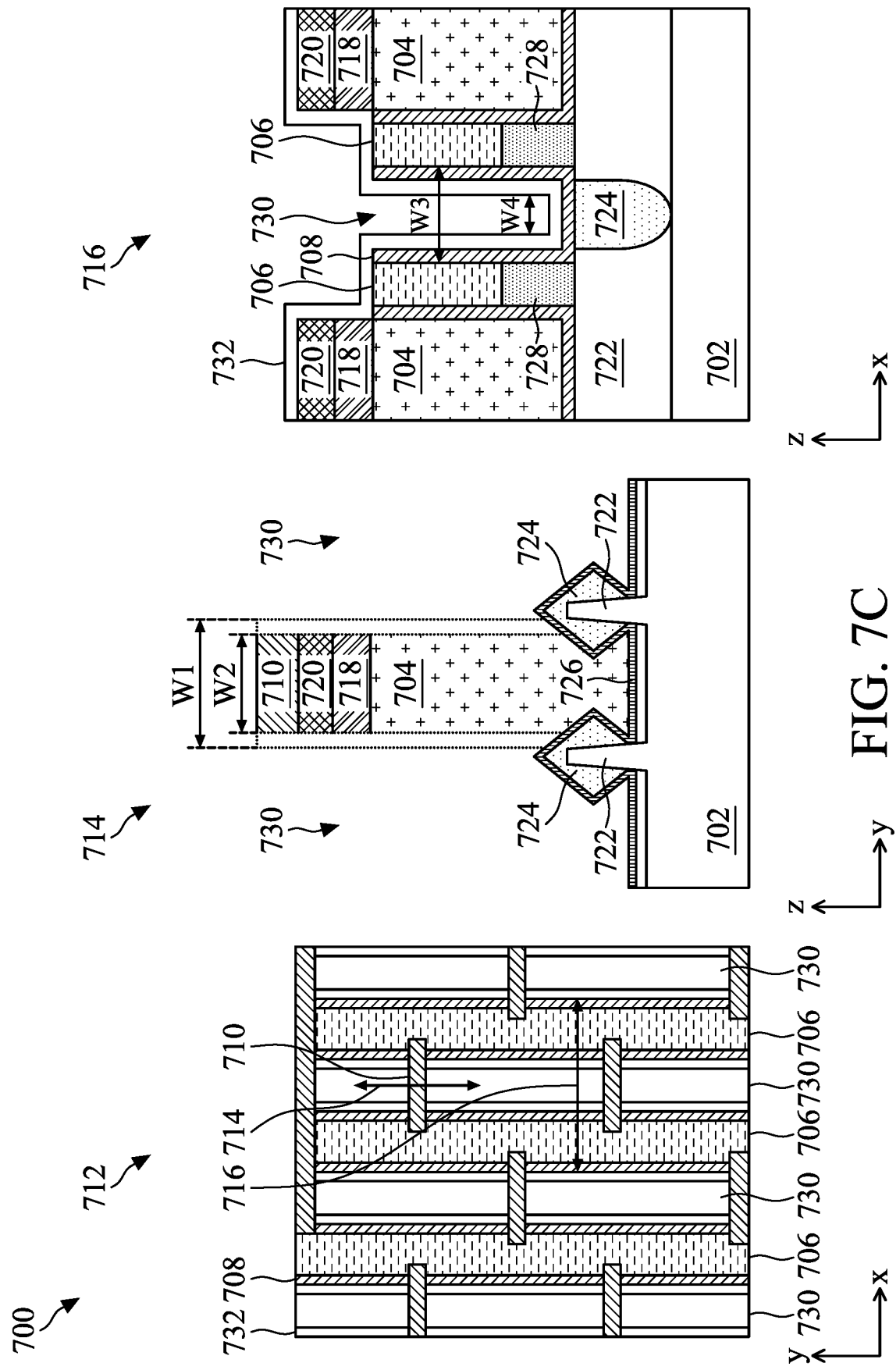

As shown in FIG. 7C, a plurality of layers 732 are formed in the recesses 730 on the sidewalls and the bottom surfaces of the recesses 730. In particular, the layer 732 is deposited on the spacers 708 on the sidewalls and on the bottom surfaces of the recesses 730. The deposition tool 102 deposits the layer 732 by a CVD technique, a PVD technique, an ALD technique, a deposition technique described above in connection with FIG. 1, and/or another deposition technique. The layer 732 includes a tungsten carbide ($W_xC_y$), a boron nitride ($B_xN_y$), a boron carbide ($B_xC$), a boron oxide ($B_xO_y$), a fluorocarbon ($C_xF_y$) polymer, and/or another material that is capable of depositing and growing on the spacers 708 (which includes a nitride material such as a silicon nitride (SixNy) or another nitride material). In some implementations, the layer 732 includes boron nitride ($B_xN_y$), and the layer 732 is formed by depositing boron chloride ($BCl_3$) onto the spacers 708 in the recesses 730. The boron chloride bonds to the nitrogen in the surfaces of the spacers 708. The surfaces of the spacers 708 are then treated with a nitrogen ($N_2$) plasma to form the boron nitride layer 732.

In some implementations, the layer 703 includes a tungsten carbide ($WC_x$), which is formed by depositing a tungsten fluoride precursor (e.g., tungsten hexafluoride ($WF_6$) or another tungsten fluoride). The tungsten fluoride reacts with a hydrofluorocarbon ($CH_xF_y$, such as difluoromethane ($CH_2F_2$) to form the tungsten carbide. The tungsten carbide is formed as a non-volatile byproduct deposition layer onto the spacers 708. The tungsten carbide that is formed on the spacers 708 is subsequently removed (e.g., by etching or another removal technique) before the cut material is deposited into the recesses 730. This is due to tungsten carbide being a poor dielectric material. In implementations where fluorocarbon ($C_xF_y$) polymer is used, a small amount of the fluorocarbon ($C_xF_y$) polymer can remain in the recesses 730 due to fluorocarbon ($C_xF_y$) polymer being a good dielectric material.

As shown in the cross-sectional view 714 in FIG. 7C, the deposition operation of the layer 732 causes the sidewall portions of the recesses 730 that include the ILD layers 704 to be etched such that material of the sidewall portions of the recesses 730 that include the ILD layers 704 is removed. In some implementations, the boron chloride contacts and reacts with the oxide material of the ILD layers 704. The reaction between the oxygen of the oxide material and the boron chloride results in the formation of a volatile by-product boron chloride oxide (BClO), which is causes a width of the portions of the ILD layers 704 under the CMD regions 710 to be reduced. In some implementations, the $WF_6$ contacts and reacts with the oxide material of the ILD layers 704. The reaction between the oxygen of the oxide material and the $WF_6$ results in the formation of a volatile by-product $WOF_4$, which is causes a width of the portions of the ILD layers 704 under the CMD regions 710 to be reduced This decreases y-direction spacing between adjacent source or drain contacts of the semiconductor device, which decreases the contact resistance for the source or drain contacts.

In some implementations, the initial width (W1) of a portion of an ILD layer 704 under a CMD region 710 is in a range of approximately 15 nanometers to approximately 300 nanometers, and the width (W2) of the portion of the ILD layer 704 under the CMD region 710 after the deposition operation of the layer 732 is in a range of approximately 10 nanometers to approximately 295 nanometers based on process capability, to achieve a particular contact resistance for the source or drain regions, and/or to reduce the likelihood of drain-to-drain leakage. However, other values for the initial width (W1) and the width (W2) after the deposition operation are within the scope of the present disclosure.

As shown in the cross-sectional view 716 in FIG. 7C, the formation of the layer 732 on the spacers 708 in the recesses 730 results in a reduction in the width of the recesses 730 between the spacers 708. This reduction in width enables the reduction in cell sizes of memory cells that are formed in the semiconductor device. This, in turn, enables increased memory cell density for the semiconductor device and increased device performance for the semiconductor device.

In some implementations, the initial width (W3) of a recess 730 between surfaces of the spacer 708 on the sidewalls of the recess 730 is in a range of approximately 10 nanometers to approximately 200 nanometers, and the width (W4) of the recess 730 after deposition of the layer 732 is in a range of approximately 9 nanometers to approximately 190 nanometers based on process capability, to achieve a particular size for the memory cells (or other circuit structures) of the semiconductor device, and/or to reduce the risk of bridging between adjacent cut polysilicon regions. However, other values for the initial width (W3) and the width (W4) after deposition of the layer 732 are within the scope of the present disclosure. In some implementations, the thickness of the layer 732 is in a range of approximately 1 nanometer to approximately 10 nanometers to sufficiently reduce the initial width (W3).

Figure 7D:
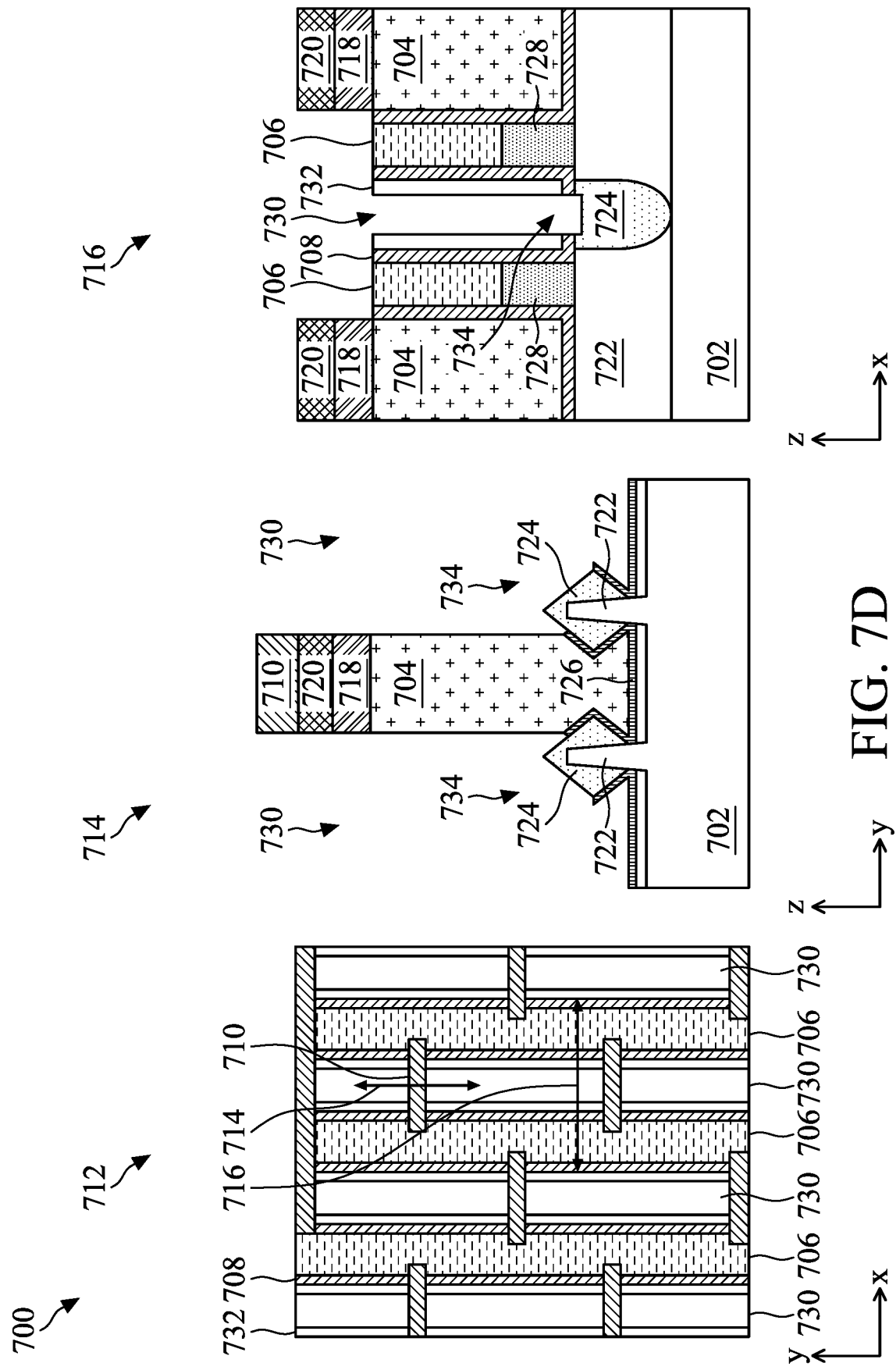

As shown in FIG. 7D, excess or residual material of the layer 732 is removed from the top surfaces of the SAC 706 and the top surfaces of the spacers 708. In some implementations, the etch tool 108 performs an etching or cleaning operation to remove the excess or residual material of the layer 732. As further shown in FIG. 7D, openings 734 are formed to the epitaxial regions 724 in preparation for forming source or drain contacts to the epitaxial regions 724. The openings 734 are formed in the recesses 730 through the layer 732, through the spacers 708, and through the BCELs 726 at the bottom of the recesses 730.

In some implementations, a pattern in a photoresist layer is used to form the openings 734. In these implementations, the deposition tool 102 forms the photoresist layer on the SACs 706, the spacers 708, and/or other portions of the semiconductor device. The exposure tool 104 exposes the photoresist layer to a radiation source to pattern the photoresist layer. The developer tool 106 develops and removes portions of the photoresist layer to expose the pattern. The etch tool 108 etches through the layer 732, through the spacers 708, and through the BCELs 726 at the bottom of the recesses 730 to form the openings 734. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 734 based on a pattern.

Figure 7E:
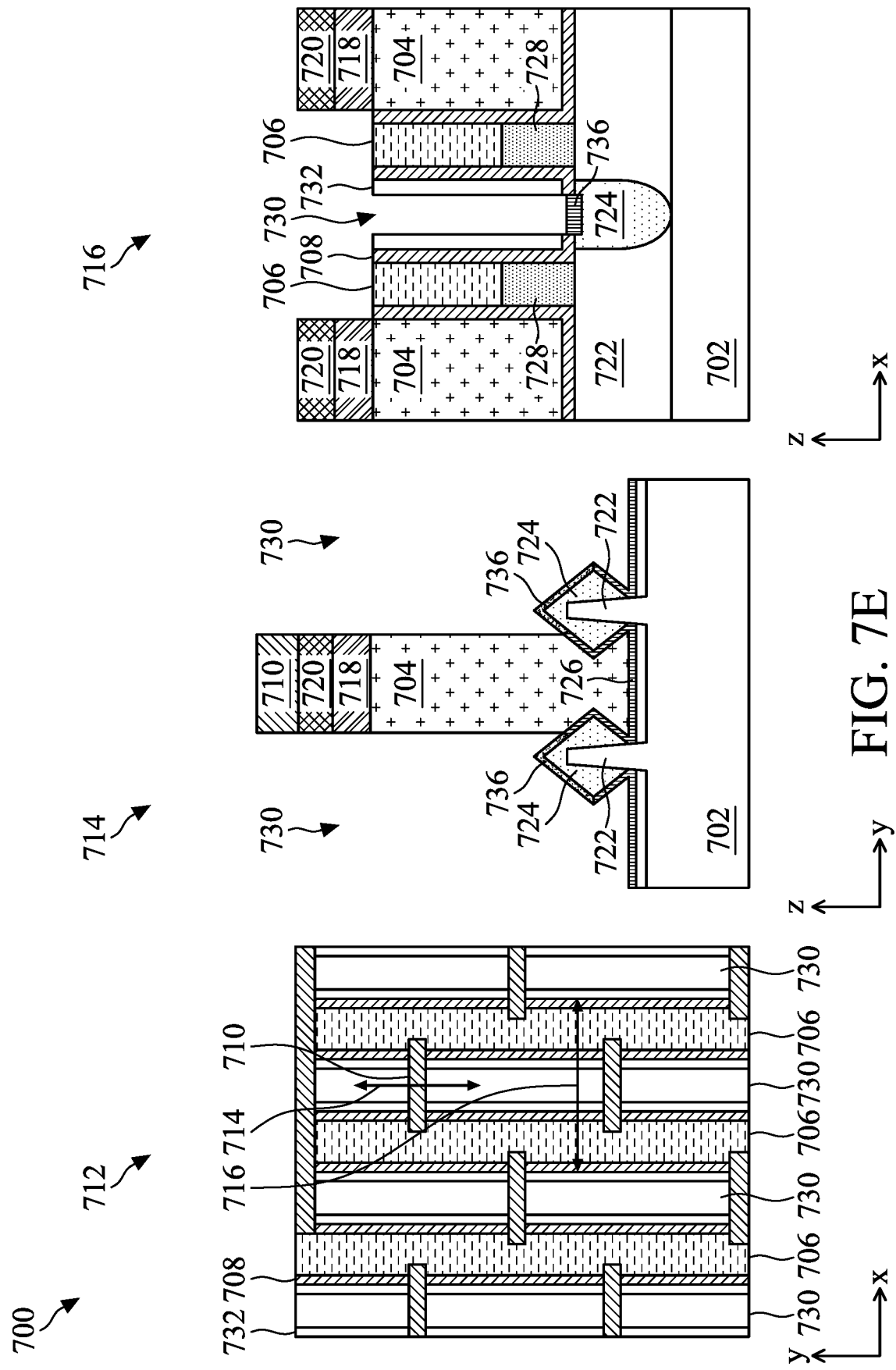

As shown in FIG. 7E, silicide layers 736 are formed in the openings 734 on the epitaxial regions 724. The silicide layers 736 include a metal silicide such as a cobalt silicide or a nickel silicide, among other examples. The silicide layers 736 are included on the epitaxial regions 724 to reduce contact resistance between the epitaxial regions 724 and the source or drain contacts that are to be formed over the epitaxial regions 724. The deposition tool 102 and/or the plating tool 112 deposits the silicide layers 736 by a CVD technique, a PVD technique, an ALD technique, an electroplating technique, another deposition technique described above in connection with FIG. 1, and/or another deposition technique.

Figure 7F:
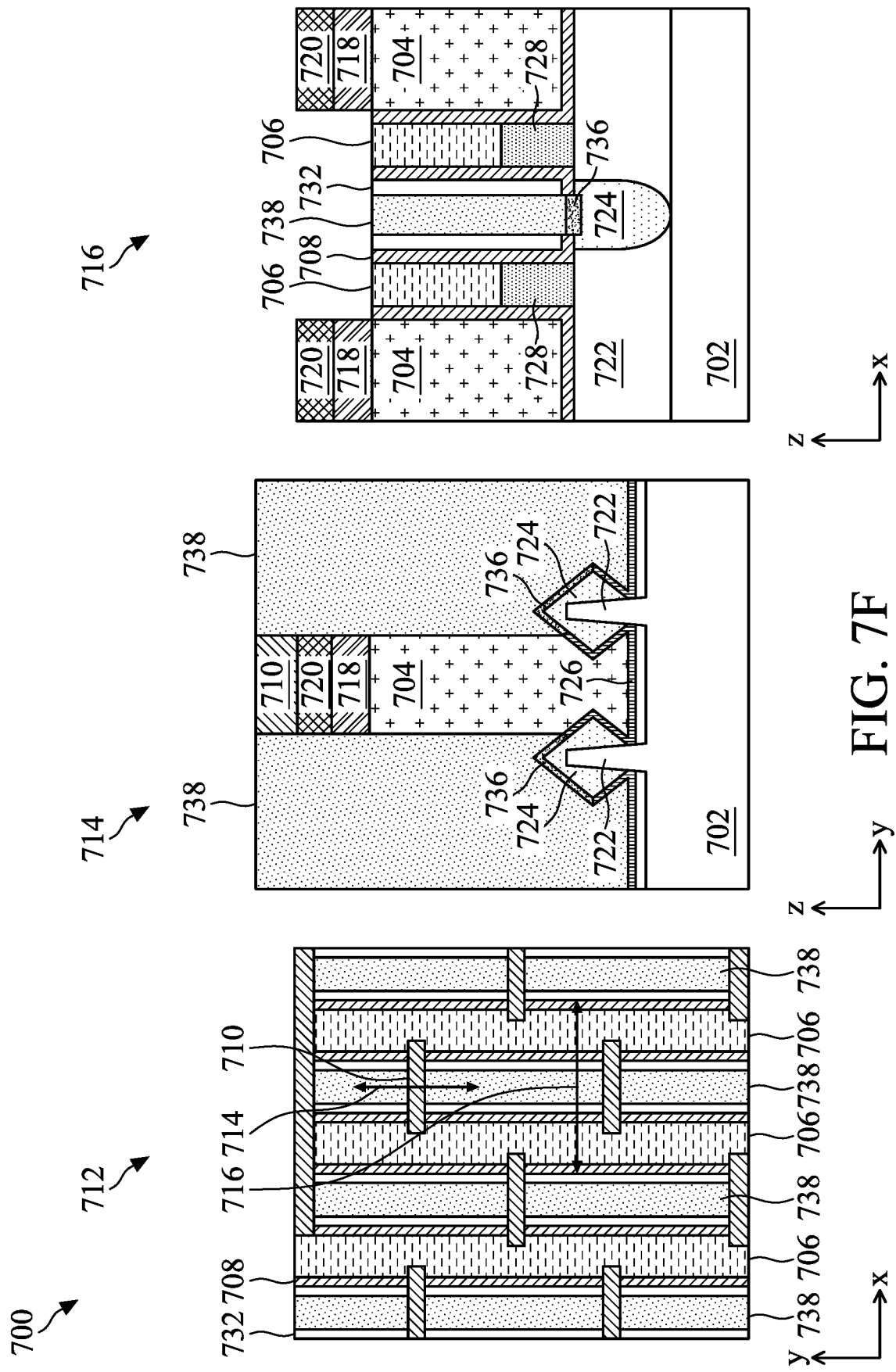

As shown in FIG. 7F, source or drain contacts 738 are formed in the recesses 730 over and/or on the silicide layers 736. The deposition tool 102 and/or the plating tool 112 deposits the source or drain contacts 738 by a CVD technique, a PECVD technique, an ALD technique, an electroplating technique, another deposition technique described above in connection with FIG. 1, and/or another deposition technique.

As indicated above, FIGS. 7A-7F are provided as an example. Other examples may differ from what is described with regard to FIG. 7A-7F.

Figure 8A:
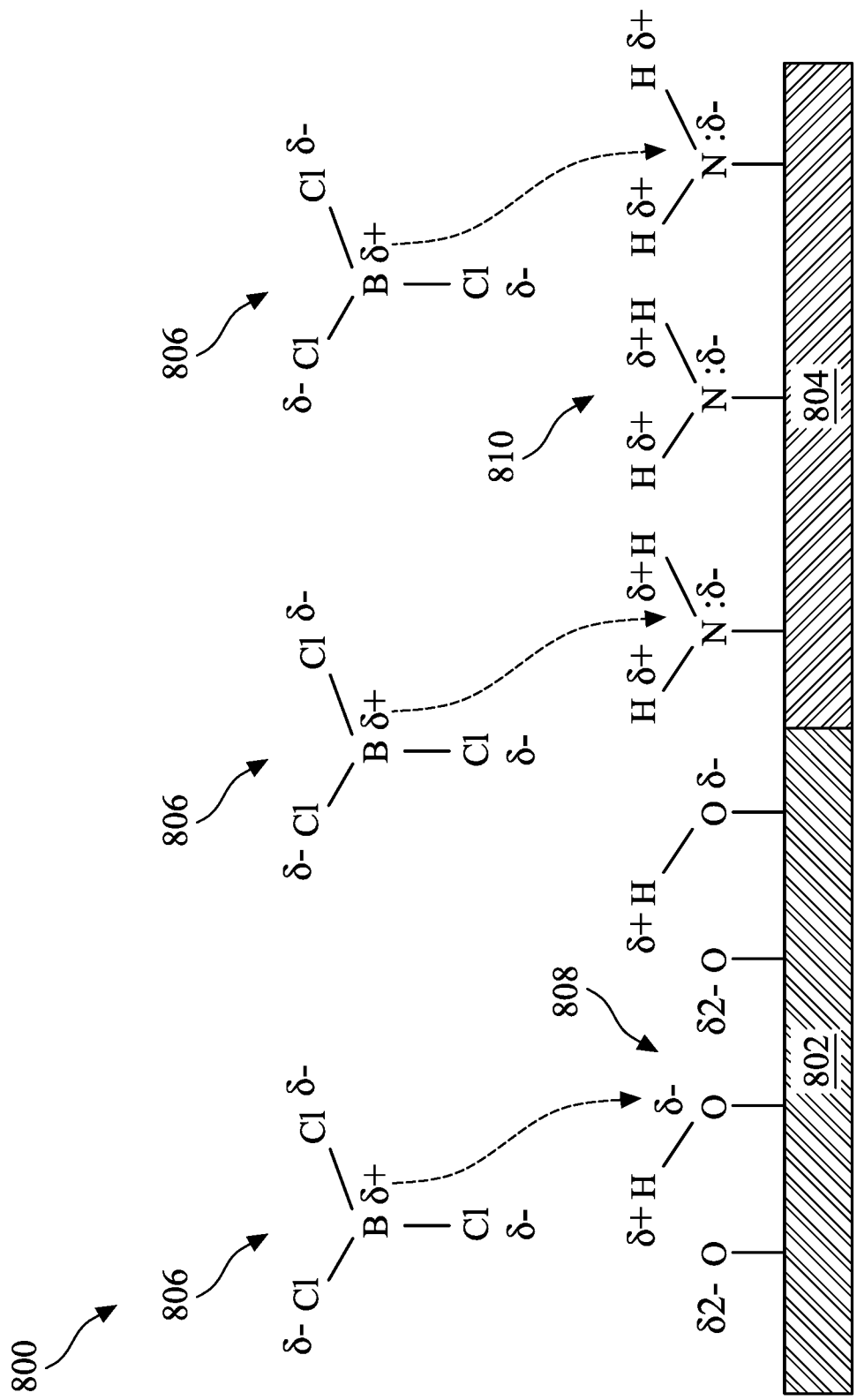

FIGS. 8A-8D are diagrams of an example implementation 800 described herein. The example implementation 800 includes an example boron nitride ($B_xN_y$) layer formation process that may be used to form various boron nitride layers described herein. As shown in FIG. 8A, the example implementation 800 includes an oxide layer 802 and a nitride layer 804. In some implementations, the oxide layer 802 includes the STI layers 506 described herein, the dielectric layers 606 described herein, and/or the dielectric layers 704 described herein, among other examples. In some implementations, the nitride layer 804 includes the active region layers 504 described herein, the polysilicon layers 604 described herein, and/or the spacers 708 described herein, among other examples.

As shown in FIG. 8A, the boron layer formation process includes a deposition operation or an in-situ deposition step at etcher (e.g., performed by the deposition tool 102 or etcher 108) in which boron chloride ($BCl_3$) 806 is deposited onto the surface of the oxide layer 802 and onto the surface of the nitride layer 804. The boron chloride 806 is deposited by a CVD or a in-situ deposition step at the etch tool 108, and/or another deposition technique. The boron chloride 806 reacts with oxygen 808 in the oxide layer 802 and reacts with nitrogen 810 in the nitride layer 804.

Figure 8B:
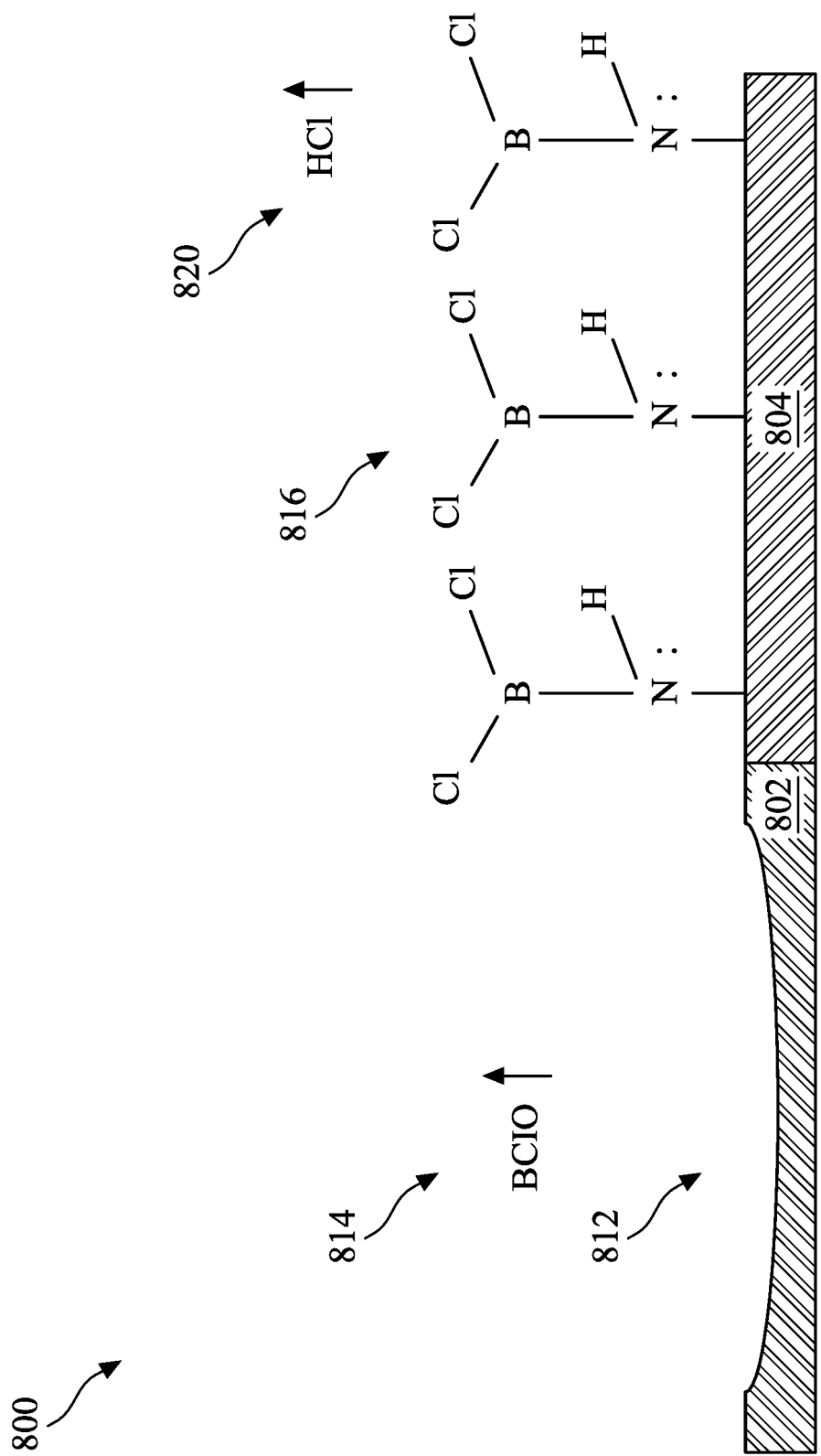

As shown in FIG. 8B, the reaction between the oxygen 808 in the oxide layer 802 and the boron chloride 806 results in the formation of a recess 812 in the oxide layer 802. Material of the oxide layer 802 is removed by the boron chloride 806, resulting in the formation of the recess 812. The combination of the oxygen 808 and the boron chloride 806 forms a volatile by-product boron oxide chloride (BClO) 814.

As further shown in FIG. 8B, the reaction between the nitrogen 810 in the nitride layer 804 and the boron chloride 806 results in bonds 816 being formed between the nitrogen 810 on the surface of the nitride layer 804 and boron in the boron chloride 806. The formation of the nitrogen-boron bonds 816 results in the formation of a by-product hydrogen chloride 818.

Figure 8C:
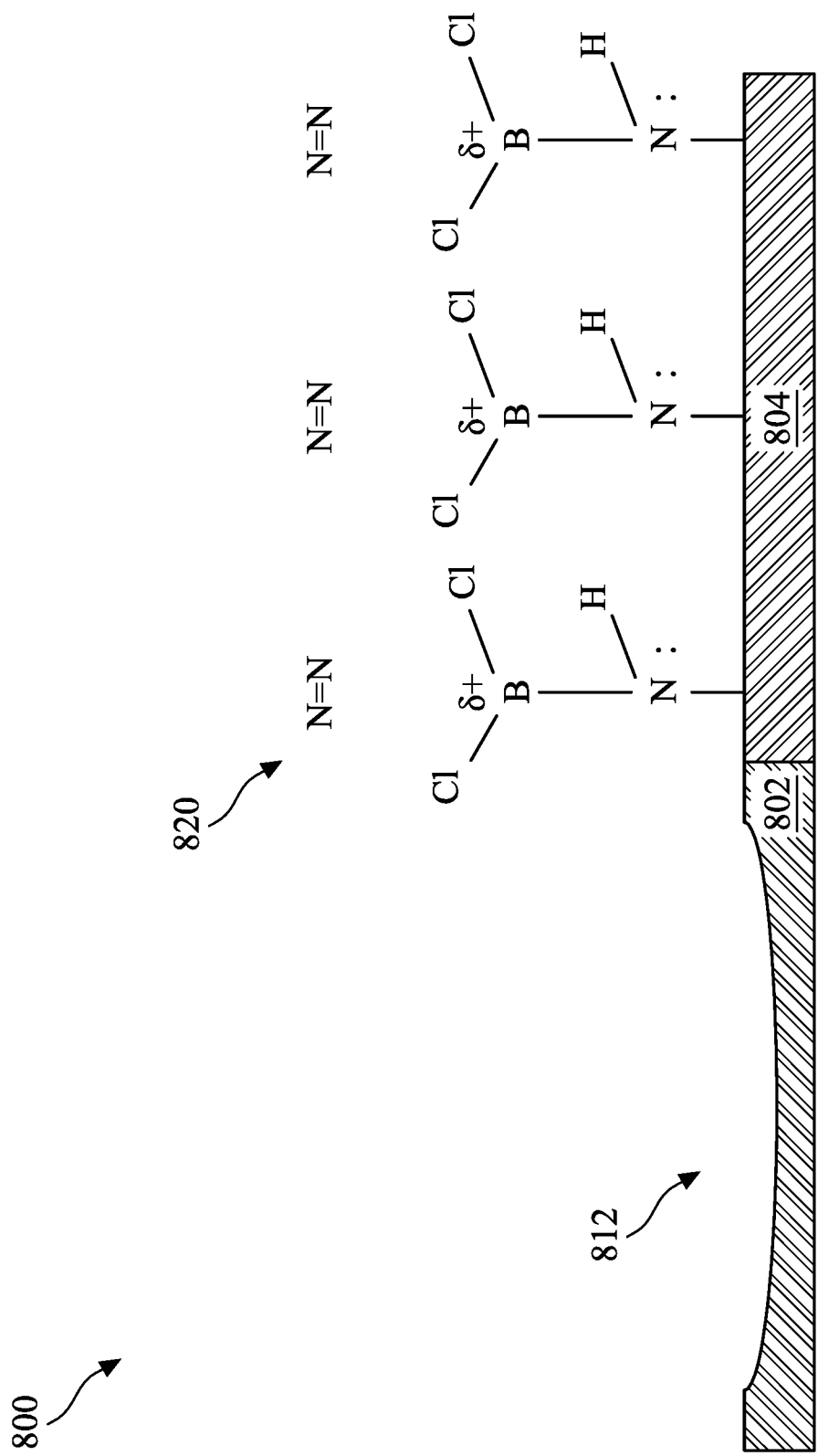

As shown in FIG. 8C, the surface of the nitride layer 804 is treated with a nitrogen ($N_2$) plasma 820. The nitrogen plasma 820 facilitates further growth of the nitrogen-boron bonds 816 on the surface of the nitride layer 804. In alternative implementations, the nitride layer 804 does not include a nitride and is instead a silicon layer. In these alternative implementations, the chloride of the boron chloride 806 bonds with the hydrogen to form the hydrogen chloride 818 by-product, and the nitrogen plasma 820 is used to form the nitrogen-boron bonds 816 on the surface of the silicon layer, which results in the formation of a boron nitride layer on the silicon layer.

Figure 8D:
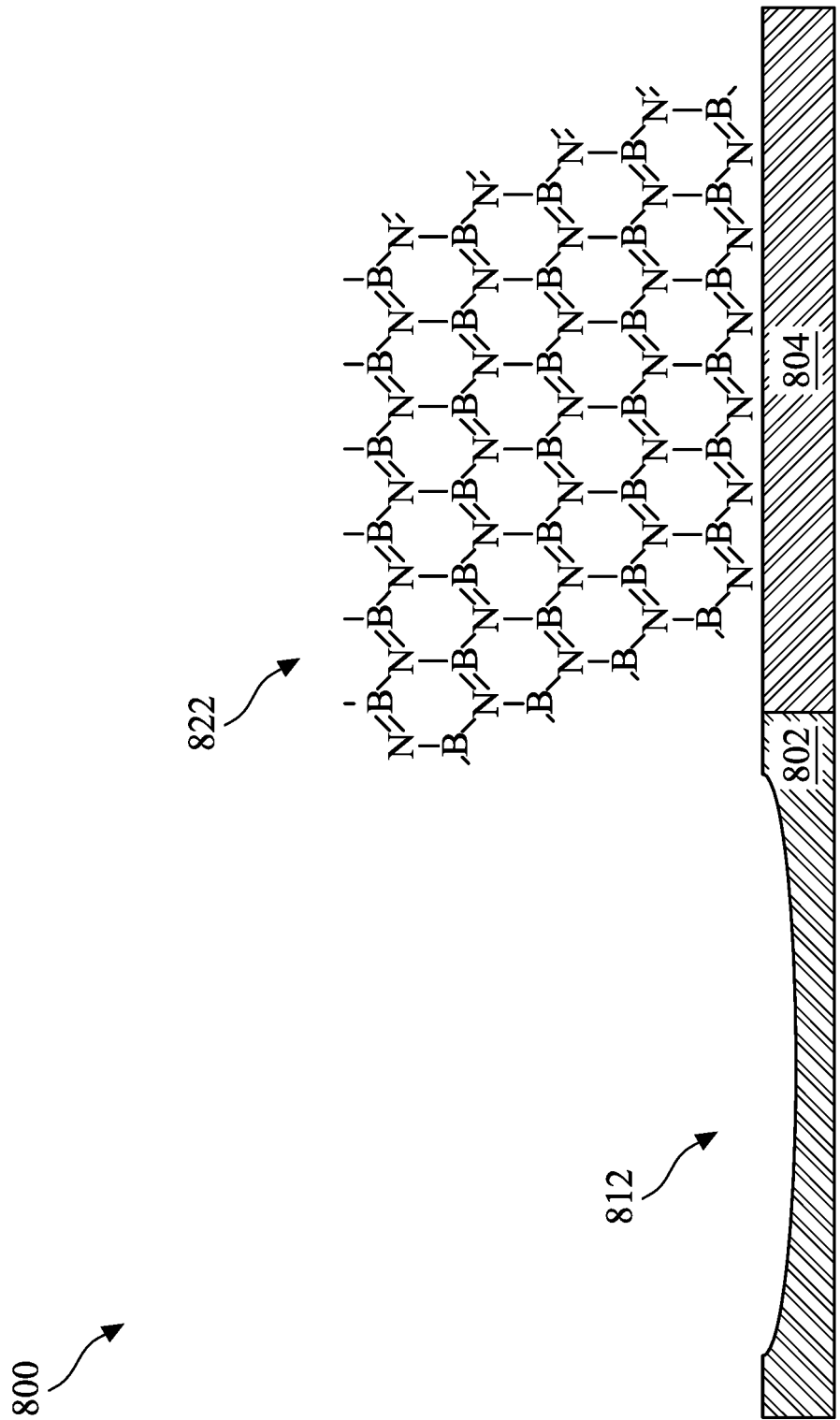

As shown in FIG. 8D, the surface treatment using the nitrogen plasma 820 results in the formation of a boron nitride layer 822 on the nitride layer 804. The boron nitride layer 822 includes a hexagonal structure. The boron nitride layer 822 has a relatively large breakdown voltage, an out-of-plane dielectric constant of approximately 3.29 (for monolayer hexagonal boron nitride (h-BN)) to approximately 3.76 (for bulk hexagonal boron nitride), and an in-plane dielectric constant of approximately 6.82 (for monolayer hexagonal boron nitride) to approximately 6.93 (for bulk hexagonal boron nitride).

In some implementations, the duration of the boron chloride deposition operation and the nitrogen plasma treatment operation is in a range of approximately 10 seconds to approximately 600 seconds to form the boron nitride layer 822 to a particular thickness on the nitride layer 804 and/or to form the recess 812 to a particular depth in the oxide layer 802. In some implementations, the ratio between the boron chloride 806 and the nitrogen plasma 820 is in range of approximately 0.1 to approximately 10 to achieve a particular boron concentration and/or a particular nitrogen concentration for the boron nitride layer 822.

As indicated above, FIGS. 8A-8D are provided as an example. Other examples may differ from what is described with regard to FIGS. 8A-8D.

Figure 9:
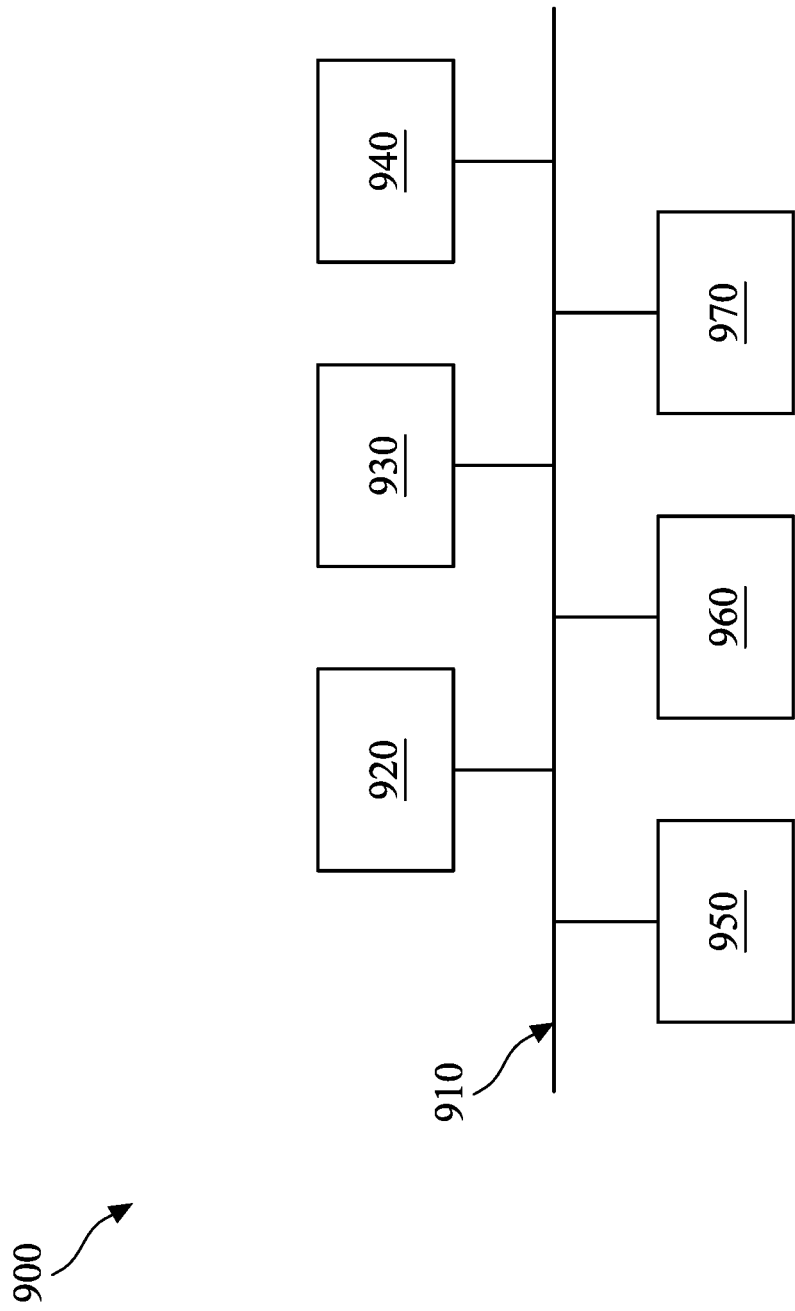
FIG. 9 is a diagram of example components of one or more devices of FIG. 1.

FIG. 9 is a diagram of example components of a device 900. In some implementations, one or more of the semiconductor process tools 102-112 and/or the wafer/die transport tool 114 includes one or more devices 900 and/or one or more components of device 900. As shown in FIG. 9, device 900 may include a bus 910, a processor 920, a memory 930, a storage component 940, an input component 950, an output component 960, and a communication component 970.

Bus 910 includes a component that enables wired and/or wireless communication among the components of device 900. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform a function. Memory 930 includes a random access memory, a read only memory, and/or another type of memory (e.g., a flash memory, a magnetic memory, and/or an optical memory).

Storage component 940 stores information and/or software related to the operation of device 900. For example, storage component 940 may include a hard disk drive, a magnetic disk drive, an optical disk drive, a solid state disk drive, a compact disc, a digital versatile disc, and/or another type of non-transitory computer-readable medium. Input component 950 enables device 900 to receive input, such as user input and/or sensed inputs. For example, input component 950 may include a touch screen, a keyboard, a keypad, a mouse, a button, a microphone, a switch, a sensor, a global positioning system component, an accelerometer, a gyroscope, and/or an actuator. Output component 960 enables device 900 to provide output, such as via a display, a speaker, and/or one or more light-emitting diodes. Communication component 970 enables device 900 to communicate with other devices, such as via a wired connection and/or a wireless connection. For example, communication component 970 may include a receiver, a transmitter, a transceiver, a modem, a network interface card, and/or an antenna.

Device 900 may perform one or more processes described herein. For example, a non-transitory computer-readable medium (e.g., memory 930 and/or storage component 940) may store a set of instructions (e.g., one or more instructions, code, software code, and/or program code) for execution by processor 920. Processor 920 may execute the set of instructions to perform one or more processes described herein. In some implementations, execution of the set of instructions, by one or more processors 920, causes the one or more processors 920 and/or the device 900 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
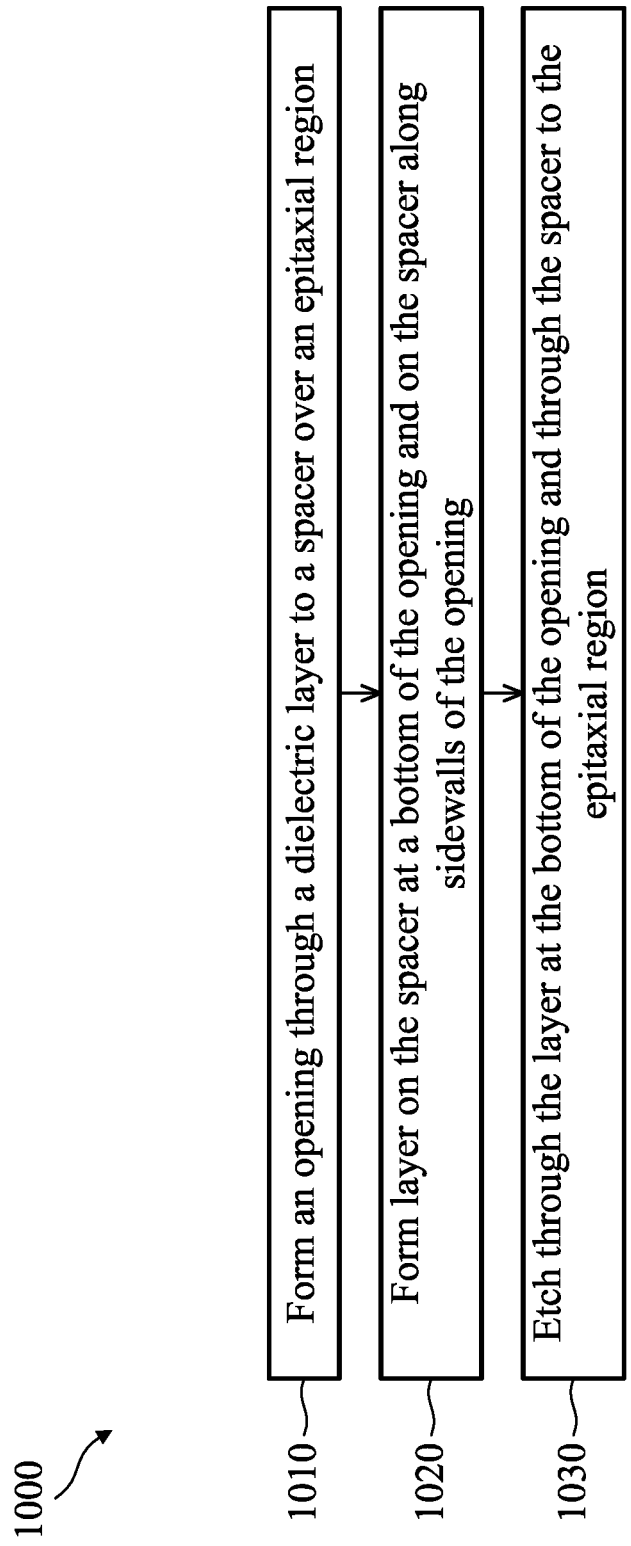
FIGS. 10 and 11 are flowcharts of example processes relating to forming a semiconductor device described herein.

FIG. 10 is a flowchart of an example process 1000 associated with forming a semiconductor device. In some implementations, one or more process blocks of FIG. 10 may be performed by one or more of semiconductor devices (e.g., one or more of the semiconductor processing tools 102-112). Additionally, or alternatively, one or more process blocks of FIG. 10 may be performed by one or more components of device 900, such as processor 920, memory 930, storage component 940, input component 950, output component 960, and/or communication component 970.

As shown in FIG. 10, process 1000 may include forming an opening through a dielectric layer to a spacer over an epitaxial region (block 1010). For example, one or more of the semiconductor processing tools 102-112 may form an opening (e.g., the recess 730) through the dielectric layer 704 to the spacer 708 over an epitaxial region 724, as described above.

As further shown in FIG. 10, process 1000 may include forming a layer on the spacer at a bottom of the opening and on the spacer along sidewalls of the opening (block 1020). For example, one or more of the semiconductor processing tools 102-112 may form the layer 732 on the spacer 708 at a bottom and on the spacer 708 sidewalls of the opening, as described above. In some implementations, the layer is formed by depositing a precursor on the spacer and treating the precursor with a plasma to form the layer. In some implementations, the layer reduces a first width of the opening along a first direction that is approximately perpendicular to the dielectric layer. In some implementations, the precursor removes material from the sidewalls of the opening to increase a second width of the opening along a second direction that is approximately parallel to the dielectric layer.

As further shown in FIG. 10, process 1000 may include etching through the layer at the bottom of the opening and through the spacer to the epitaxial region (block 1030). For example, one or more of the semiconductor processing tools 102-112 may etch through the layer 732 at the bottom of the opening and through the spacer 708 to the epitaxial region 724, as described above.

Process 1000 may include additional implementations, such as any single implementation or any combination of implementations described below and/or in connection with one or more other processes described elsewhere herein.

In a first implementation, process 1000 includes forming a source or drain contact 738 in the opening over the epitaxial region 724 after etching through the layer 732 at the bottom of the opening and through the spacer 708 to the epitaxial region 724. In a second implementation, alone or in combination with the first implementation, the epitaxial region 724 includes a source region or drain region of a finFET (e.g., included in the semiconductor device 200 or the memory cell 300). In a third implementation, alone or in combination with one or more of the first and second implementations, a material of the layer 732 includes at least one of a tungsten carbide ($W_xC_y$), a boron nitride ($B_xN_y$), a boron carbide ($B_xC$), a boron oxide ($B_xO_y$), or a fluorocarbon ($C_xF_y$) polymer.

In a fourth implementation, alone or in combination with one or more of the first through third implementations, a width (W1) of the CMD region 710 between adjacent openings through the dielectric layer 704 is reduced during formation of the layer 732. In a fifth implementation, alone or in combination with one or more of the first through fourth implementations, the layer 732 reduces a width (W3) of the opening.

In a sixth implementation, alone or in combination with one or more of the first through fifth implementations, forming the layer 732 includes depositing boron chloride (BCl3) 806 onto the spacer 708 as the precursor, where the boron chloride 806 bonds with nitrogen 810 on a surface of the spacer 708, and treating the surface of the spacer 708 with a nitrogen ($N_2$) plasma 820 to form the layer 732, where the nitrogen 810 on the surface of the spacer 708 and the nitrogen plasma 820 react with the boron chloride 806 to form boron nitride ($B_xN_y$) 822. In a seventh implementation, alone or in combination with one or more of the first through sixth implementations, the boron chloride 806 reacts with oxygen 808 in the dielectric layer 704 to remove one or more portions 814 of the dielectric layer 704.

In an eighth implementation, alone or in combination with one or more of the first through seventh implementations, the second width being increased results in an increased width for the metal source or drain contact, which reduces contact resistance of the metal source or drain contact. In a ninth implementation, alone or in combination with one or more of the first through eighth implementations, forming the layer includes depositing tungsten hexafluoride ($WF_6$) onto a surface spacer as the precursor, treating the surface of the spacer with difluoromethane ($CH_2F_2$), where the tungsten of the tungsten hexafluoride reacts with the difluoromethane on the surface of the spacer to form tungsten carbide ($WC_x$) as the layer, where the tungsten hexafluoride reacts with oxygen in the dielectric layer to remove one or more portions of the dielectric layer, and the tungsten hexafluoride and the oxygen form a volatile by-product tungsten(VI) oxytetrafluoride ($WOF_4$).

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

Figure 11:
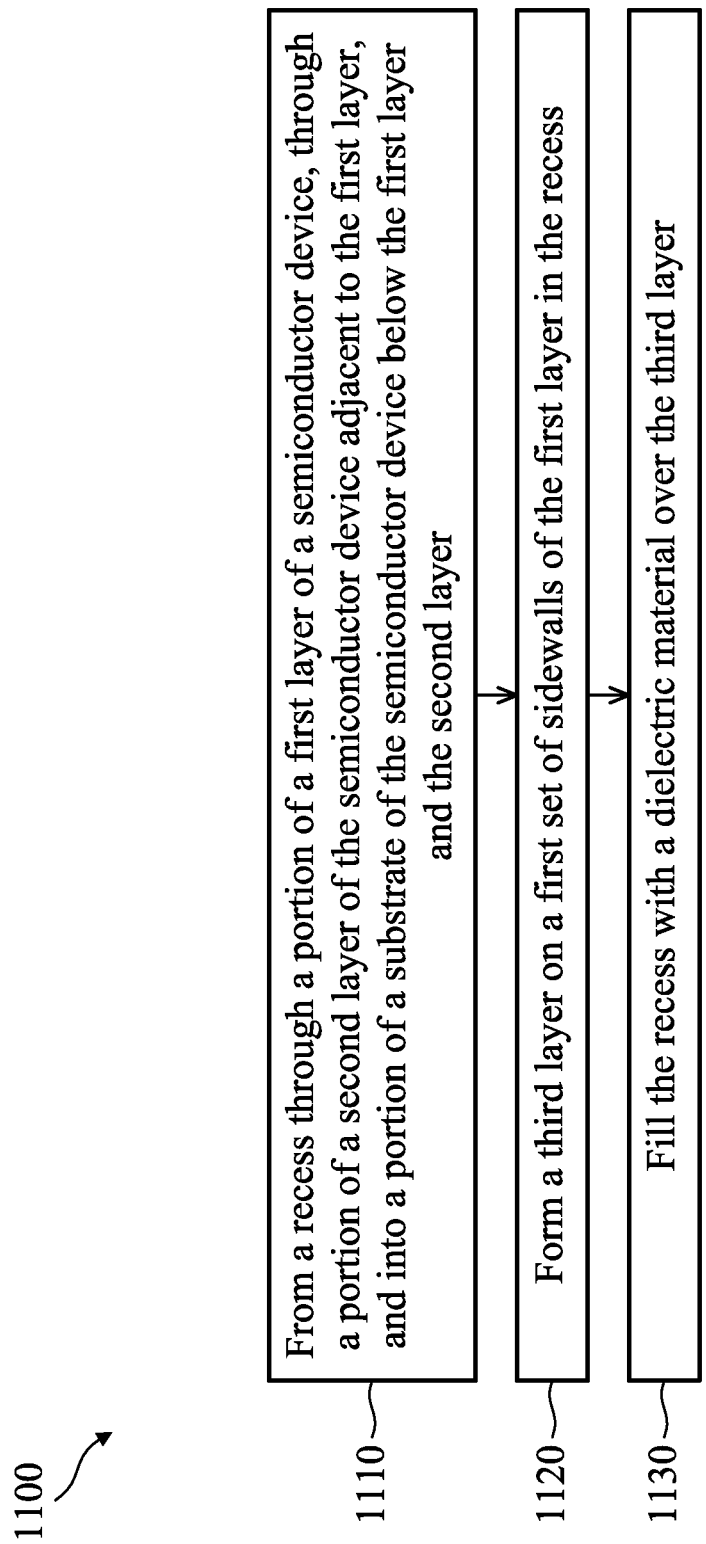

FIG. 11 is a flowchart of an example process 1100 associated with forming a semiconductor device described herein. In some implementations, one or more process blocks of FIG. 11 may be performed by one or more of the semiconductor processing tools 102-112 (e.g., one or more of the semiconductor processing tools 102-112). Additionally, or alternatively, one or more process blocks of FIG. 11 may be performed by one or more components of device 900, such as processor 920, memory 930, storage component 940, input component 950, output component 960, and/or communication component 970.

As shown in FIG. 11, process 1100 may include forming a recess through a portion of a first layer of a semiconductor device, through a portion of a second layer of the semiconductor device adjacent to the first layer, and into a portion of a substrate of the semiconductor device below the first layer and the second layer (block 1110). For example, one or more of the semiconductor processing tools 102-112 may form a recess (e.g., the recess 514, 614) through a portion of a first layer (e.g., an active region layer 504, a polysilicon layer 604) of the semiconductor device 200, through a portion of a second layer (e.g., an STI layer 506, an dielectric layer 606) of the semiconductor device 200 adjacent to the first layer, and into a portion of a substrate (e.g., the substrate 202, 502, 602) of the semiconductor device 200 below the first layer and the second layer, as described above. In some implementations, the recess includes a first set of sidewalls corresponding to the first layer and a second set of sidewalls corresponding to the second layer.

As further shown in FIG. 11, process 1100 may include forming a third layer on the first set of sidewalls of the first layer in the recess (block 1120). For example, one or more of the semiconductor processing tools 102-112 may form a third layer (e.g., the layer 516, the layer 616) on the first set of sidewalls of the first layer in the recess, as described above. In some implementations, a precursor that is used to form the third layer wherein the precursor reacts with a combination of a first material of the first layer and a nitrogen plasma to form the third layer on the first set of sidewalls of the first layer in the recess. In some implementations, the third layer decreases a first width of recess between the first set of sidewalls. In some implementations, the precursor reacts with a second material of the second layer to etch the second set of sidewalls of the second layer in the recess, which increases a second width of the recess between the second set of sidewalls.

As further shown in FIG. 11, process 1100 may include filling the recess with a dielectric material over the third layer (block 1130). For example, one or more of the semiconductor processing tools 102-112 may fill the recess with a dielectric material (e.g., a cut active region 518 (or fin cut isolation region 518), a cut polysilicon region 618 (or gate cut isolation regions 618 or gate isolation regions 618)) over the third layer, as described above.

Process 1100 may include additional implementations, such as any single implementation or any combination of implementations described below and/or in connection with one or more other processes described elsewhere herein.

In a first implementation, a material of the third layer includes at least one of a tungsten carbide ($W_xC_y$), a boron nitride ($B_xN_y$), a boron carbide ($B_xC$), a boron oxide ($B_xO_y$), or a fluorocarbon ($C_xF_y$) polymer. In a second implementation, alone or in combination with the first implementation, the first layer includes an active region layer 504, the second layer includes an STI layer 506, and the dielectric material includes a cut active region 518 (or fin cut isolation region 518).

In a third implementation, alone or in combination with one or more of the first and second implementations, the first layer includes a polysilicon layer 604, the second layer includes a dielectric layer, and the dielectric material includes a cut polysilicon region 618 (or gate cut isolation regions 618 or gate isolation regions 618). In a fourth implementation, alone or in combination with one or more of the first through third implementations, the first width of the recess (e.g., the width (W1) of the recess 514, the width (W1) of the recess 614) is along the first layer and includes an x-direction width of a cut region corresponding to the dielectric material, the second width of the recess (e.g., the width (W2) of the recess 514, the width (W2) of the recess 614) is across the first layer and includes a y-direction width of the cut region, the third layer decreases a critical dimension of the cut region. In a fifth implementation, alone or in combination with one or more of the first through fourth implementations, forming the third layer includes forming the third layer to a thickness in a range of approximately 1 nanometer to approximately 10 nanometers.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

Figure 12:
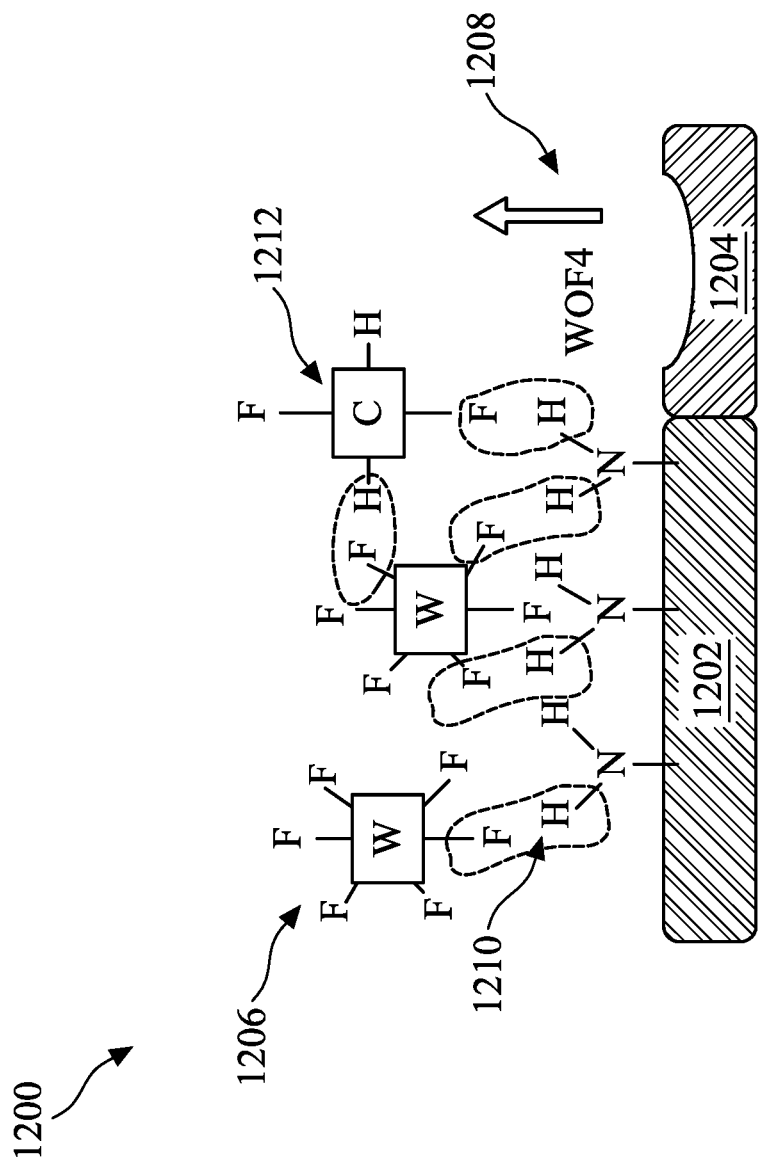
FIG. 12 is a diagram of an example implementation described herein.

FIG. 12 is a diagram of an example implementation 1200 described herein. The example implementation 1200 includes an example tungsten carbide ($WC_x$) layer formation process that may be used to form various tungsten carbide layers described herein. As shown in FIG. 12, the example implementation 1200 includes a nitride layer 1202 (which may alternatively include a silicon layer) and an oxide layer 1204. In some implementations, the oxide layer 1204 includes the STI layers 506 described herein, the dielectric layers 606 described herein, and/or the dielectric layers 704 described herein, among other examples. In some implementations, the nitride layer 1202 (or silicon layer) includes the active region layers 504 described herein, the polysilicon layers 604 described herein, and/or the spacers 708 described herein, among other examples.

As shown in FIG. 12, the tungsten carbide layer formation process includes a deposition operation or an in-situ deposition step at etcher (e.g., performed by the deposition tool 102 or etcher 108) in which tungsten hexafluoride ($WF_6$) is deposited onto the surface of the oxide layer 1204 and onto the surface of the nitride layer 1202. The tungsten hexafluoride 1206 is deposited by a CVD or an in-situ deposition step at the etch tool 108, and/or another deposition technique. The tungsten hexafluoride 1206 reacts with oxygen in the oxide layer 1204 to cause the formation of a volatile by-product $WOF_4$, which results in the oxide layer 1204 being etched.

As further shown in FIG. 12, fluorine in the tungsten hexafluoride 1206 bonds with hydrogen on the surface of the nitride layer 1202 to form hydrofluoric acid (HF). Moreover, a hydrofluorocarbon 1212 ($CH_xF_y$, such as difluoromethane ($CH_2F_2$) is provided which also bonds with hydrogen on the surface of the nitride layer 1202 to form hydrofluoric acid (HF). The carbon in the hydrofluorocarbon 1212 bonds with the tungsten in the tungsten hexafluoride 1206 to form the tungsten hexafluoride ($WF_6$) on the surface of the nitride layer 1202.

As indicated above, FIG. 12 is provided as an example. Other examples may differ from what is described with regard to FIG. 12.

In this way, various semiconductor techniques described herein enable reductions in one or more sizes of a finFET (and/or another type of semiconductor transistor) and/or increasing one or more sizes of a finFET. In various implementations described herein, a boron nitride ($B_xN_y$), a boron carbide ($B_xC$), a boron oxide ($B_xO_y$) (e.g., boric oxide ($B_2O_3$), a fluorocarbon (CxFy) polymer, and/or another material may be used to reduce the one or more x-direction sizes of the finFET by selective deposition while enabling the one or more y-direction sizes of the finFET to be increased or enlarged by etching. For example, the x-direction size of an MD of the finFET, the x-direction size of an active region of the finFET, and/or the x-direction size of a poly region of the finFET may be increased by selective deposition of a boron nitride ($B_xN_y$), a boron carbide ($B_xC$), a boron oxide ($B_xO_y$) (e.g., boric oxide ($B_2O_3$), a fluorocarbon (CxFy) polymer, and/or another material. The selective deposition may permit the one or more y-direction sizes of a finFET to be increased by etching. In this way, reducing one or more x-direction sizes of a finFET using the techniques described herein may permit CMOS logic device sizes (e.g., cell sizes of SRAM devices and/or other types of memory devices) to be reduced. Moreover, increasing one or more y-direction sizes of a finFET using the techniques described herein may permit various semiconductor processing windows to be enlarged, which may increase semiconductor manufacturing quality and semiconductor manufacturing yield.

As described in greater detail above, some implementations described herein provide a method. The method includes forming an opening through a dielectric layer to a spacer over an epitaxial region. The method includes forming a layer on the spacer at a bottom of the opening and on the spacer along sidewalls of the opening. The layer is formed by depositing a precursor on the spacer and treating the precursor with a plasma to form the layer. The layer reduces a first width of the opening along a first direction that is approximately perpendicular to the dielectric layer. The precursor removes material from the sidewalls of the opening to increase a second width of the opening along a second direction that is approximately parallel to the dielectric layer. The method includes etching through the layer at the bottom of the opening and through the spacer to the epitaxial region.

As described in greater detail above, some implementations described herein provide a method. The method includes forming a recess through a portion of a first layer of a semiconductor device, through a portion of a second layer of the semiconductor device adjacent to the first layer, and into a portion of a substrate of the semiconductor device below the first layer and the second layer. The recess includes a first set of sidewalls corresponding to the first layer and a second set of sidewalls corresponding to the second layer. The method includes forming a third layer on the first set of sidewalls of the first layer in the recess. A precursor is used to form the third layer, the precursor reacts with a combination of a first material of the first layer and a nitrogen plasma to form the third layer on the first set of sidewalls of the first layer in the recess. The third layer decreases a first width of recess between the first set of sidewalls. The precursor reacts with a second material of the second layer to etch the second set of sidewalls of the second layer in the recess, which increases a second width of the recess between the second set of sidewalls. The method includes filling the recess with a dielectric material over the third layer.

As described in greater detail above, some implementations described herein provide a semiconductor device. The semiconductor device includes a first active region and a second active region, on a substrate of the semiconductor device, that extend in a same direction. The semiconductor device includes a fin cut isolation region in the first active region and the second active region. The semiconductor device includes a source or drain region in the first active region and the second active region. The semiconductor device includes a contact electrically connected to the source or drain region. The semiconductor device includes a shallow trench isolation layer adjacent to the first active region and the second active region. The semiconductor device includes a first gate region and a second gate region that extend in a second direction approximately perpendicular to the first direction. The semiconductor device includes a gate cut isolation region between the first gate region and the second gate region. The semiconductor device includes at least one of a first boron nitride layer between the contact and a spacer associated with the contact, a second boron nitride layer between the fin cut isolation region and the first active region and between the fin cut region and the second active region, or a third boron nitride layer between the gate cut isolation region and the first gate region and between the gate cut region and the second gate region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
  a first active region and a second active region, on a substrate of the semiconductor device, that extend in a first direction;
  a fin cut isolation region located between the first active region and the second active region;
  a source or drain region in the first active region and the second active region;
  a contact electrically connected to the source or drain region;
  a shallow trench isolation (STI) layer adjacent to the first active region and the second active region;
  a first gate region and a second gate region that extends in a second direction approximately perpendicular to the first direction;
  a gate cut isolation region between the first gate region and the second gate region; and
  at least one of:
    a first boron nitride layer between the contact and a spacer associated with the contact,
    a second boron nitride layer between the fin cut isolation region and the first active region and between the fin cut isolation region and the second active region, or
    a third boron nitride layer between the gate cut isolation region and the first gate region and between the gate cut region and the second gate region.

2. The semiconductor device of claim 1, further comprising at least two of:
  a first boron nitride layer between the contact and a spacer associated with the contact,
  a second boron nitride layer between the fin cut isolation region and the first active region and between the fin cut isolation region and the second active region, or
  a third boron nitride layer between the gate cut isolation region and the first gate region and between the gate cut region and the second gate region.

3. The semiconductor device of claim 1, further comprising:
  the first boron nitride layer,
    wherein a width of the contact adjacent to the first boron nitride layer is in a range of approximately 9 nanometers to approximately 190 nanometers.

4. The semiconductor device of claim 1, further comprising:
  the second boron nitride layer,
    wherein a first width of the fin cut isolation region adjacent to the second boron nitride layer is in a range of approximately 5 nanometers to approximately 200 nanometers; and
    wherein a second width of the fin cut isolation region is in a range of approximately 8 nanometers to approximately 225 nanometers.

5. The semiconductor device of claim 4, wherein the second boron nitride layer is between the fin cut isolation region and the substrate, and
  wherein the third boron nitride layer is between the gate cut isolation region and the substrate.

6. The semiconductor device of claim 1, further comprising:
  the third boron nitride layer,
    wherein a width of the gate cut isolation region adjacent to the third boron nitride layer is in a range of approximately 10 nanometers to approximately 200 nanometers.

7. The semiconductor device of claim 6, wherein another width of the gate cut isolation region is in a range of approximately 15 nanometers to approximately 225 nanometers.

8. A semiconductor device, comprising:
  an active region layer on a substrate;
  a shallow trench isolation (STI) layer on the substrate; and
  a first layer in an opening, wherein the opening is in the active region layer, the STI layer, and a portion of the substrate.

9. The semiconductor device of claim 8, further comprising:
  a plurality of active region layers, including the active region layer, on the substrate; and
  a plurality of STI layers, including the STI layer and alternating with the plurality of active region layers, on the substrate.

10. The semiconductor device of claim 8, further comprising:
  a fin cut out region on the first layer.

11. The semiconductor device of claim 8, wherein the first layer is on the substrate and sidewall portions of the active region layer.

12. The semiconductor device of claim 8, wherein the first layer is on the substrate and is distanced away from the STI layer.

13. The semiconductor device of claim 8, wherein the first layer includes one or more of:
  a tungsten carbide ($W_xC_y$),
  a boron nitride ($B_xN_y$),
  a boron carbide ($B_xC$),
  a boron oxide ($B_xO_y$), or
  a fluorocarbon ($C_xF_y$) polymer.

14. The semiconductor device of claim 8, wherein active region is further on at least one of the substrate or the STI layer.

15. A semiconductor device, comprising:
  a plurality of fin structures at least partially in a substrate;

a plurality of epitaxial regions surrounding the plurality of fin structures;

a plurality of bottom contrast enhancement layer on the plurality of epitaxial regions;

a plurality of silicide layers on the plurality of epitaxial regions; and a plurality of source or drain contacts on the plurality of silicide layers.

16. The semiconductor device of claim 15, further comprising:

a plurality of interlayer dielectric (ILD) layers over the substrate and surrounding at least one of the plurality of silicide layers and the plurality of source or drain contacts.

17. The semiconductor device of claim 16, further comprising:

one or more hard masks on the plurality of ILD layers.

18. The semiconductor device of claim 16, further comprising:

a plurality of sacrificial layer structures (SACs) over the fin structures and surrounding at least one of the plurality of silicide layers and the plurality of source or drain contacts.

19. The semiconductor device of claim 18, wherein the plurality of ILD layers and the plurality of SACs are arranged in an alternating pattern.

20. The semiconductor device of claim 18, further comprising:

a plurality of gates on the plurality of fin structures, wherein the SAC layers are on the plurality of gates.

* * * * *